US008810249B2

(12) United States Patent
Cehelnik

(10) Patent No.: US 8,810,249 B2
(45) Date of Patent: Aug. 19, 2014

(54) E-FIELD SENSOR ARRAYS FOR INTERACTIVE GAMING, COMPUTER INTERFACES, MACHINE VISION, MEDICAL IMAGING, AND GEOLOGICAL EXPLORATION CIP

(76) Inventor: Thomas G. Cehelnik, Sahuarita, AZ (US)

( * ) Notice: Subject to any disclaimer, the term of this patent is extended or adjusted under 35 U.S.C. 154(b) by 0 days.

(21) Appl. No.: 12/661,824

(22) Filed: Mar. 22, 2010

(65) Prior Publication Data

US 2010/0253319 A1    Oct. 7, 2010

Related U.S. Application Data

(63) Continuation-in-part of application No. 12/383,252, filed on Mar. 20, 2009.

(51) Int. Cl.
*G01R 29/12* (2006.01)
(52) U.S. Cl.
USPC ........... 324/457; 324/663; 324/664; 324/665; 324/688
(58) Field of Classification Search
USPC .......................................... 324/457, 663–688
See application file for complete search history.

(56) References Cited

U.S. PATENT DOCUMENTS

| | | | |
|---|---|---|---|
| 3,543,056 A * | 11/1970 | Klein | 327/517 |
| 4,016,490 A | 4/1977 | Weckenmann et al. | |
| 4,169,260 A | 9/1979 | Bayer | |
| 5,028,875 A | 7/1991 | Peters | |
| 5,130,672 A | 7/1992 | Watkiss et al. | |
| 5,276,406 A * | 1/1994 | Samay et al. | 330/277 |
| 5,408,411 A | 4/1995 | Makamura et al. | |
| 5,436,613 A | 7/1995 | Ghosh et al. | |
| 5,570,010 A * | 10/1996 | Jin et al. | 324/67 |
| 5,730,165 A | 3/1998 | Philipp | |
| 5,844,415 A | 12/1998 | Gershenfeld et al. | |
| 5,880,627 A | 3/1999 | Thiel | |
| 6,025,726 A | 2/2000 | Gershenfeld et al. | |
| 6,051,981 A | 4/2000 | Gershenfeld et al. | |
| 6,066,954 A | 5/2000 | Gershenfeld et al. | |
| 6,150,945 A | 11/2000 | Wilson | |

(Continued)

OTHER PUBLICATIONS

Morse et al.; Methods of Theoretical Physics, Part II: Chapters 9 to 13; McGraw-Hill Book Company, Inc.; 1953.

(Continued)

*Primary Examiner* — Huy Q Phan
*Assistant Examiner* — Temilade S Rhodes-Vivour
(74) *Attorney, Agent, or Firm* — Thomas G Cehelnik

(57) ABSTRACT

A 3D Motional Command System (MCS) is disclosed for interactive gaming, computer interfaces, communications, imaging, and geological exploration. The system can perform standoff gesture recognition and also function as touch-screens. E-field sensors and array topologies are disclosed comprised of FET discrete transistors. The designs facilitate the fabrication of high density sensor arrays similar to LCD displays. The system can be used in portable and wearable electronic devices. Uses are for PC computers, portable devices, and gaming systems such as the Wii. Other applications include wireless connection of sensor and audio data from a simple headphone jack output.

21 Claims, 21 Drawing Sheets

(56) References Cited

U.S. PATENT DOCUMENTS

| | | | |
|---|---|---|---|
| 6,333,691 B1 | | 12/2001 | Janus |
| 6,628,265 B2 | | 9/2003 | Hwang |
| 6,686,800 B2 | | 2/2004 | Krupka |
| 6,794,728 B1 | * | 9/2004 | Kithil .......................... 257/532 |
| 6,859,141 B1 | * | 2/2005 | Van Schyndel et al. ...... 340/562 |
| 6,922,059 B2 | * | 7/2005 | Zank et al. ................... 324/457 |
| 6,968,171 B2 | | 11/2005 | Vanderhelm et al. |
| 7,078,911 B2 | * | 7/2006 | Cehelnik ...................... 324/457 |
| 7,242,298 B2 | * | 7/2007 | Cehelnik ...................... 340/566 |
| 2002/0033706 A1 | * | 3/2002 | Khazei .......................... 324/750 |
| 2002/0093491 A1 | * | 7/2002 | Gillespie et al. ............. 345/173 |
| 2004/0004488 A1 | * | 1/2004 | Baxter .......................... 324/678 |
| 2004/0251918 A1 | * | 12/2004 | Cehelnik ...................... 324/663 |
| 2005/0068046 A1 | * | 3/2005 | Frey et al. ..................... 324/686 |
| 2005/0212531 A1 | * | 9/2005 | Wei .............................. 324/664 |
| 2006/0017123 A1 | * | 1/2006 | Ghallab et al. ............... 257/414 |
| 2009/0206852 A1 | * | 8/2009 | Reynolds ...................... 324/688 |
| 2009/0224776 A1 | * | 9/2009 | Keith ........................... 324/686 |

OTHER PUBLICATIONS

Seo et al; Electrical Impedance Tomography for Imaging and Lesion Estimation; Chapter 7; pp. 193-198.

Smith et al.; Field Mice: Extracting Hand Geometry From Electric Field Measurements; IBM Systems Journal; vol. 35. No. 384; 1996.

William Beaty Publications on Internet in Regard to Electrostatic or Electric Field Sensors; http://www.amasci.com/electron/e-field2.txt; Note: DC Detection Only; 1994.

New Week Nov. 17, 2003; "Play Station 2 Gets an Eyeful" Demonstrates/Discusses Capability of MCS but Uses Camera/Video Instead of Electric Field Sensing.

William Beaty Internet Publication; 1987; "Ridiculously Sensitive Charge Detector"; DC Only; www.amasci.com/emotor/chargedet. html.

* cited by examiner a)

b)

a)    A-B = V3-V1 + V5-V3 ...
        A = V2 + V4 +...

E-FIELD SENSOR ARRAYS FOR INTERACTIVE GAMING, COMPUTER INTERFACES, MACHINE VISION, MEDICAL IMAGING, AND GEOLOGICAL EXPLORATION CIP

This application is a continuation-in-part (CIP) to and is to receive benefit of application Ser. No. 12/383,252 with title "E-field sensor arrays for interactive gaming, computer interfaces, machine vision, medical imaging, and geological exploration" filed on Mar. 20, 2009.

This application is to receive benefit by reference of provisional applications 61/070,099 with title "E-field Imaging and Proximity Detection Using a Spatially and Temporally Modulated Source" filed on Mar. 20, 2008; and 61/070,106 with title "E-Field Sensor Arrays for Imaging and Computer Interfaces", filed on Mar. 21, 2008.

CROSS REFERENCE TO RELATED APPLICATIONS

This application is related to subject matter in U.S. patent applications with Ser. No. 60/445,548 filed Feb. 6, 2003, and Ser. No. 10/772,908 filed Feb. 5, 2004 that is now issued on Jul. 18, 2006 as U.S. Pat. No. 7,078,911 with title "A Patent Application for a Computer Motional Command Interface". This application is related to subject material in U.S. patent applications, 60/515,844 and Ser. No. 10/978,142 filed on Oct. 29, 2004. These applications resulted in U.S. Pat. No. 7,242,298 issued on Jul. 10, 2007 with title "Method and Apparatus for Detecting Charge and Proximity".

This application is related to subject material in U.S. patent application Ser. No. 11/376,026 filed Mar. 15, 2006. This application issued Apr. 15, 2008 as U.S. Pat. No. 7,358,742 with title "DC & AC Coupled E-field Sensor".

This application is to related to the subject matter U.S. patent application 60/689,975 filed Jun. 5, 2005, and Ser. No. 11/446,768 filed Jun. 5, 2006 and pending with title "Method for Alerting Physical Approach".

This application is related to subject matter in U.S. patent application 60/689,975 filed Jun. 5, 2005, and Ser. No. 11/449,151 filed Jun. 6, 2006 now abandon unintentionally. This application was simply a domestic priority amendment to Ser. No. 11/446,768 but there was no number issued to refer to it due to a missing part including the inventors name. The inventor was not notified because of the missing name and the application went abandon. The amendment was to make the application a continuation-in-part and to receive the benefits of U.S. patent application Ser. Nos. 10/772,908, 10/978,142.

New material is supported and this application shall receive the benefit of provisional applications 61/070,099 Mar. 20, 2008, and 61/070,106 of Mar. 21, 2008.

Provisional applications 61/070,099 with title "E-field Imaging and Proximity Detection Using a Spatially and Temporally Modulated Source" filed on Mar. 20, 2008, and 61/070,106 with title "E-Field Sensor Arrays for Imaging and Computer Interfaces", filed on Mar. 21, 2008.

Predecessors to 61/070,099 and 61/070,106 are 60/934,039 and 60/881,672, respectively, which are now expired.

This application is a continuation in part to and is to receive benefit of application Ser. No. 12/383,252 with title "E-field sensor arrays for interactive gaming, computer interfaces, machine vision, medical imaging, and geological exploration" filed on Mar. 20, 2009.

STATEMENT OF FEDERALLY SPONSORED RESEARCH OR DEVELOPMENT

Not applicable

REFERENCE SEQUENCE LISTING OR COMPUTER PROGRAM

Not applicable

FIELD OF INVENTION

The major field of this invention disclosure is the art of human-machine-interaction (HMI) that includes technologies for interactive gaming, computer control and interfaces, and robotic and machine vision. Short range wireless communications is another field such as that used to communication between portable and wearable devices such a phones, iPoDs and MP3 players, headsets, microphones and other sensors such a Wii Controllers, or mice. Another field is that of imaging such as medical imaging and nondestructive testing. Another field is proximity sensing and alarms.

SUMMARY OF THE INVENTION

This invention describes how to make and process signals from a sensor panel made from arrays of E-field sensors. To make the sensor panel, transistor level E-field sensors technology is disclosed herein that was needed to minimize size and component cost, and facilitate interconnections and placement of sensor elements. Several sensor panel configurations are described that lend themselves to different applications. The sensor panel technology can be used in Motional Command Systems, Communications systems, and in Imaging Systems.

This invention describes how to achieve compact integration of E-field sensor technology by specifically describing how to:
  1) Make transistor level E-field sensors.
  2) Make arrays of transistor level E-fields sensor.
  3) Signal condition the array signals for to achieve array performance.
  4) Process array signals to extract useful information.

In a Motional Command System (MCS), the sensor panel technology has the potential of being integrated in video display screen technologies such as flat panel displays, 3D holographic display systems, TVs, and in peripheral devices such as mice and smart-Pads and smart-gloves.

As the Interactive control systems market expands additional need is recognized for Motional Command Systems. Particularly need exists in human machine interface (HMI) of computers and apparatus. Smaller electronic devices require better user control interfaces since small buttons and small video screens are often difficult to use.

The disclosed technology makes possible the introduction of our concept of "Smart Screens", that have touch screen capability and also have proximity and motion recognition enabled Graphical User Interface (GUI) control buttons, or "Smart Controls". Smart Controls are programmable areas of the video display or sensor panel that sets up embedded E-field sensing arrays to recognize hand, finger, or stylus motional commands. The cursor can be made to hover, move, and then snap and click to activate enabled controls, and initiate a motional command.

Smart controls facilitate the user's interaction with smart boards, tables, and portable electronics such as phones and PDAs, electronic. A MCS design is contemplated to have smart control on a video display monitor by using a transparent film of an array of E-field sensors overlaid on an LCD or plasma display.

In communication systems, the sensor panel technology offers signal strength and bandwidth trades to permit short range communications between peripheral devices and people. Just as an example, this can be digital video data sent between a wearable processor such as an IPod video play and a video eye glasses display or headset display. In this case, minuscule video data signals, the size of that appearing on the body when touching a video display unit, are coupled over the body to the wearable display unit containing the E-field sensor. The E-field sensor transfers the signal to the display processor for display. There is no need for an embedded radio connection. The power levels are low, and there is not necessary a need for FCC transmitter license and certification when the video player is already certified.

Another communications example is the communication of analog signals between sensors and devices. Today audio signals are commonly coupled into listening devices through telecoils or FM transceivers. For example telephones couple their audio into hearing aids vial telecoils or with FM transceivers. Listening devices that help people hear TVs and partner microphones commonly use FM transceivers. Using the new technology of E-field sensors disclosed here and supported in previous patent applications, we can replace the telecoil and FM transceiver with a wire antenna on the audio jack or the audio output of the microphone, use an E-fields sensor in the listening device. Even audio data can be sent to cochlea implants from a receiving microphone at the ear and sent through the skull to the cochlea stimulator.

More generally, the systems can benefit by sending data from a sensor output through objects to other sensors, processors or devices. This means objects can be smart and be aware of the others presences. A low cost E-field communications system either can be made digital or analog. Simple analog systems E-field receiver and transmitter in objects would allow objects those objects to know if they are proximate one another. Radio systems or computer networks can then relay the status of the neighboring objects.

Client objects with embedded E-field transmitter, receivers, or transceivers, can be made to wakeup and made to turn on E-field sensing and processing to preserve batteries. Applications include games, toys, mail delivery and store security. These E-field smart client object can also be a part of a radio frequency Identification Technology or RFID as a network, or can be made to queued and receive power from a remote RF from the RFID system.

Another example is the authentication of the presence of a person via using a analog signal representation produced by an E-field generator on or within a person and detected with an E-field receiver at a point of sale. The relationship between the electric field and the electric potential measured at the point of sale has a relationship that depends upon how far away the person is from the point of sale. Hence, physical location proximate the point of sale unit can be confirmed by measuring the two parameter relations at the point of sale.

Furthermore, biometric data is fused with individual E-field codes to make a key. This can be done by having an E-field transmitter array, see 61/070,106. For example, the E-field array transmits spatial and temporal E-fields through the back of the hand or other biometric body element into an E-field spatial array as a receiver. Now biometric data is fused with the E-field code and is no long just biometric data by itself. Biometric data such as palmprints and fingerprints and other unique identifiable features of a person may be consider too private to release into databases since it is usually unique and unchangeable. However, fused data may be chosen to be probabilistically unique but also changeable, because the code can be changed if needed. Hence, the system authenticates the person by establishing presence to the point of sale and a unique biometrically fused code.

Also the communications of short range data such as credit card information and medical information or record information can be communicated over an E-field transceiver network between user and point of sale. Various schemes can be created to validate the user. Wallets can be kept on a wearable chip or implanted chip in a person and data exchange can happen via the E-field sensor technology offering short range in person communication.

In imaging systems, E-field imaging yields pictures representative of the dielectric contrast of an object in a way similar to X-rays without the safety concerns of using ionizing radiation. Cehelnik, has described this approach in U.S. Pat. No. 7,242,298. Presented now, is a method of using the array technology to scan objects and along with some processing methods. These can be used in medical imaging, and nondestructive testing and measurements for sub-Hertz frequencies to 10s to 100s of MHz depending upon spatial dimension of the sensing system. Penetrating low frequencies are used to see deep into geological structures such as in the exploration of the earth and planets to aid in search of natural resources.

ASPECTS OF THE INVENTION

The main aspects of this invention is show how to make and use an E-field array system for a motional command system (MCS) where a body such a wand, stylus, or control body or control surface such as a hand or finger is moved in an interaction volume and the motion is recognizable to a control system for a computer or other apparatus. The E-field array can also function as a touch screen. Depending upon the application, the MCS systems using the array technology described here can be used in a passive mode or active mode. Passive mode is where the background signals are used. Active mode is where a source signal is generated for the purpose of the MCS. Both modes can be in contact or non-contacts, where the person has to make body contract with the source signal.

The technology has applications interactive gaming, computer interfaces, machine vision, medical imaging, and geological exploration.

Aspects of the invention include:
1. An E-field sensor equivalently called an element, or plurality of elements is used in an array of electrodes or equivalently referred to as antennas or sensing electrodes. Each element is comprised of a sensing electrode connected to the gate of a Field Effect Transistor of types Junction Field Effect Transistor (JFET), or Metal Oxide Semiconductor Field Effect Transistor (MOSFET) or future generations of these devices that operate as a field effect transistor or FET. In our discussion, we use the term FET(s) to imply a JFET or MOSFET, or other more advanced device that operates similarly.
2. A means of biasing the FET(s) so it operates as an amplifier or FET buffer with an operating point where the voltage signal or electric field on the gate of the FET(s) junction is translated to an representative electrical modulated signal obtained from an electrical power supply providing current through Drain and Source of the FET(s).
3. A novel distribution of array elements conveniently packaged such that an interaction volume can be sensed for changes in E-field vector components.

4. A means of exposing the sensing electrodes of the E-field sensors to an E-field used to detect the proximity of the object.
5. A means of switching array sensor elements to a differential signal amplifier for signal conditioning.
6. A means of providing a known source electric field, either a background or one created from a source, or combination thereof, and then applying it to a body either by exposing the body to the electric field without physical contact or with a physical connection. This can be achieved with an external AC electric field or a DC electric field, or by fixing the AC or DC potential of the body by establishing a contact with a voltage source.
7. A means of filtering or controlling the frequency bandwidth of operation of the signal to allow for the detection of the E-field sensor response to a body proximate the sensor.
8. A means of amplifying the difference between the reference potential of the circuit and the sensor FET Sensor signal.
9. A means of examining the signal levels for an element resulting in the determination of proximity of an object to an element; or to provide a measure of the E-field signal level presented to an element that is indicative of the local dielectric property or charge of the body that is proximate the sensor element.

Another aspect of this invention is to show how to increase the signal strength and gain of an E-field array so as to increase the range of operation.

It is another aspect of this invention to show how to lay out arrays with sensing elements in several useful array configurations.

Another aspect of this invention is to show how to signal condition and to process E-field signals needed to cover the sensing in the volume of interest while maintaining a compact or flat panel or conformal form factor.

Yet another aspect of this invention is to show configurations that were found useful in operating in passive contact mode, and active non-contact mode, and active contact mode.

This patent application and Cehelnik's previous applications teach how to modify the sensor design to operate over other frequencies of interest for other E-field applications including geological exploration, medical imaging, and communications. Other applications exist and one skilled in the art can make changes to this MCS design to accommodate the need but are covered in this invention.

BRIEF DESCRIPTION OF DRAWINGS

The following drawing will assist in understanding the invention.

BACKGROUND OF THE TECHNOLOGY

The technology uses safe electrostatic or quasistatic electric fields called E-fields. The sensing location occurs within the near field zone of an alternating electromagnetic source. The source may be background signals in passive modes or a generated signal in active mode. E-fields can range from sub-Hertz frequencies to 10s or even 100s of MHz or more depending upon the spatial extent of the sensing system relative to the source field wavelength.

A key characteristic of an E-field system is the source and receiver are separated by a distance much less than a wavelength of the electromagnetic energy, a condition referred to as the near field zone. E-field sensing is different from radio systems because radio relies on generating radiated power that propagates out to infinity in the far field zone. On the other hand, E-field sensing does not need a source that radiates power, it must have a sensor sensitive enough to detect electric fields and relate changes to the situational environment.

The challenge to the design of E-field systems is to gain useful information about an environment due to its electric fields. E-fields sensors can detect radio waves but when used in a system containing near fields source they detect E-fields. E-field sensing technology presented herein is novel because historically, near fields generated by equipment, power lines, and electronics are considered noise when they are produced by sources not intended for radio transmissions.

A critical part of making E-fields sensors is tailoring the frequency response to the desired application and to provide the stable biasing to achieve desired sensitivity. The challenge of E-field sensing has been first aimed at sensing low frequencies or quasistatic fields that required DC coupled sensors such as described by Beatty and Zank et. al.

Cehelnik then taught in U.S. Pat. No. 7,078,911 how to tailoring the frequency response with an equivalent circuit and bias resistor to allow for passive mode decrease in a background signal when the body was in contact with earth-ground.

Cehelnik, next taught in U.S. Pat. No. 7,242,298 that capturing simultaneous E-field signals of DC and AC sensor coupled signal provided addition information in a passive system about a plastic or static charged object held in the hand. Again the body was earth grounded.

Figure 1:
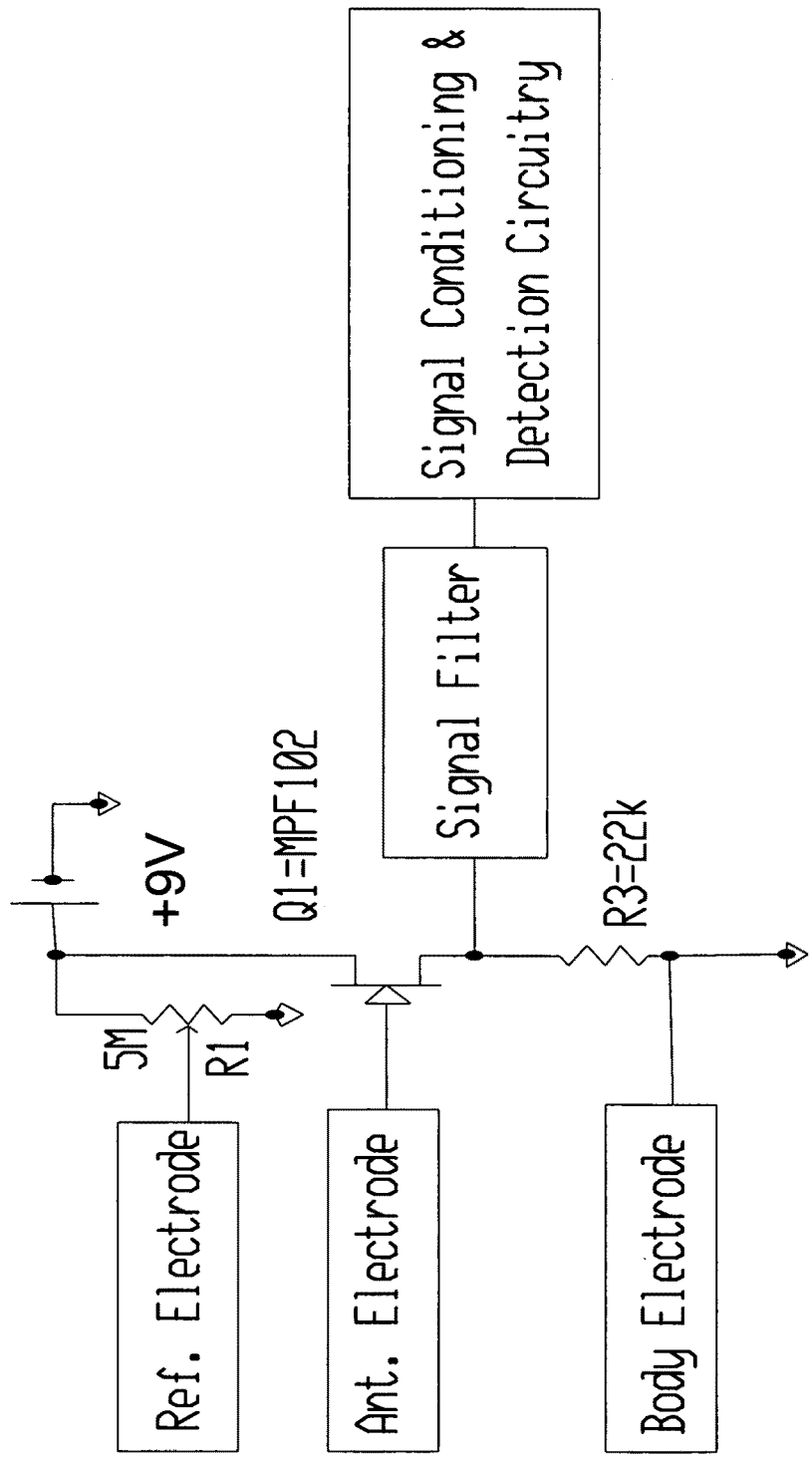
FIG. 1a) Shows FET floating gate E-field sensor element with E-field bias example.
FIG. 1b) Shows a switched voltage or capacitor arrangement for a single FET transistor E-field sensor.
FIG. 1c) a switched voltage or capacitor arrangement for an opamp E-field sensor.
Figure 1:
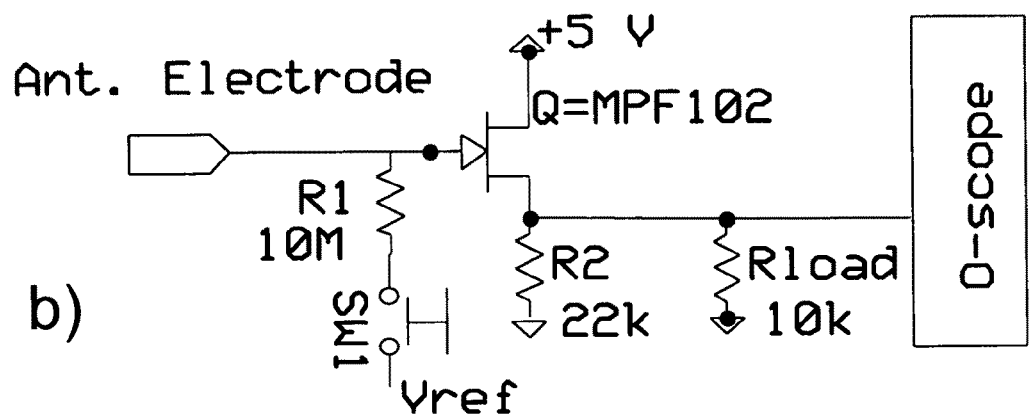
Figure 1:
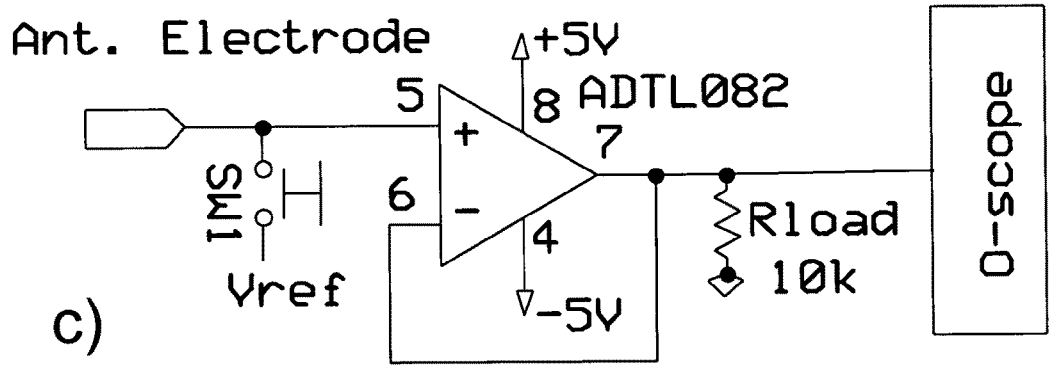

Both U.S. Pat. Nos. 7,078,911, and 7,242,298 of these specifications stated the sensors could detect active signals. A difference amplifier was also introduced between a common ground electrode and the active antenna and the common as shown in FIG. 1 of U.S. Pat. No. 7,242,298.

Cehelnik, then taught in U.S. Pat. No. 7,358,742 how an E-field bias electrode is useful and 442 can be used to control the AC sensitivity and DC bias of an E-field sensor. These E-field sensor system in this case were done with the passive case of the body being earth grounded or held at a fixed potential relative to ground.

Still pending, Cehelnik's Ser. No. 11/446,768 Method of Alerting Physical Approach and the provisional patent application 61/070,106 both showed the exploration of sensor configurations used to detect proximity of bodies in operational modes such as that used with portable devices when the body is not earth grounded. These included passive with body earth grounded, passive with body floating or at a fixed potential relative to ground, and active where body is augmented with a potential.

In previously stated references, except for Beaty, the E-fields sensor had a sensing electrode connected to an integrated circuit operational amplifier. Integrated circuits operational amplifiers are not transistor level building blocks, and thus to populate a compact high density array of such sensors is prohibitive in cost, and size. Even though Beaty had a floating gate, the disclosed design is primitive as there was no bias resistors but an LED. The frequency response was not controlled.

In provisional application 61/070,106, Cehelnik shows how to use an active DC signal on a body and control the AC output of the background. A floating input opamp circuit is used. The E-field bias is used to control the operating point of the opamp. The DC offset at the output is monitored and a feedback is used to adjust the voltage on the reference electrode. The reference electrode is the shield of a coax, and the center part is connected to an antenna element.

In provisional application 61/070,106 a discrete transistor JFET E-field sensor and an array cross hatch configuration are described. A difference amplifier is shown at the output of the FET amplifier teaching that by touching the common of the battery operated device with one hand, and moving another body part close to the sensing electrode that the sensors output voltage decreases giving the similar behavior as shown in U.S. Pat. No. 7,078,911 with an earth ground. The reason for this behavior is if one touches the common electrode that is floating and the body is floating, the body conducts the background field and moving the hand the other hand closer to the sensing electrode the signal is seen to increase. The difference amplifier is needed make the measurements relative to the floating body.

In provisional application 61/070,106, and its duplicate predecessor filed around Jun. 11, 2007, a floating gate "Smart-Pad" array in FIG. 4a) item [1] was disclosed on circuit board. It was made of parallel sensor antennas on a double sided circuit board with orthogonal elements on opposite sides and was Cehelnik's first insight to a configuration for compact high density arrays wiring scheme capable of being integrated into computer display technology. Several FET biasing and switching schemes were discussed to allow for a two dimensional array of M+N elements instead of M×N combination like pixels.

However, using the floating gate array circuit of JFETs MPF102 shown in FIG. 4a as the first attempt of making a "Smart Pad" had some problems discovered for after filing making it unsuitable for a MCS systems.

A problem was the bias on the gate eventually floated away causing the output to turn off or clip when it was used away from a computer display. This may not occur as problem when the array is mounted on the display or a large conducting plane at dominating reference control potential. The floating gate FET was indeed successfully used as a sensor to pick up E-fields from a CRT and LCD displays as discussed in 61/070,099, "E-field Imaging and Proximity Detection Using a Spatially and Temporally Modulated Source". Note, the voltage was +9 V making the gain more than the Smart Pad. The smart pad was being run with a +5V Vdd supply.

Figure 3:
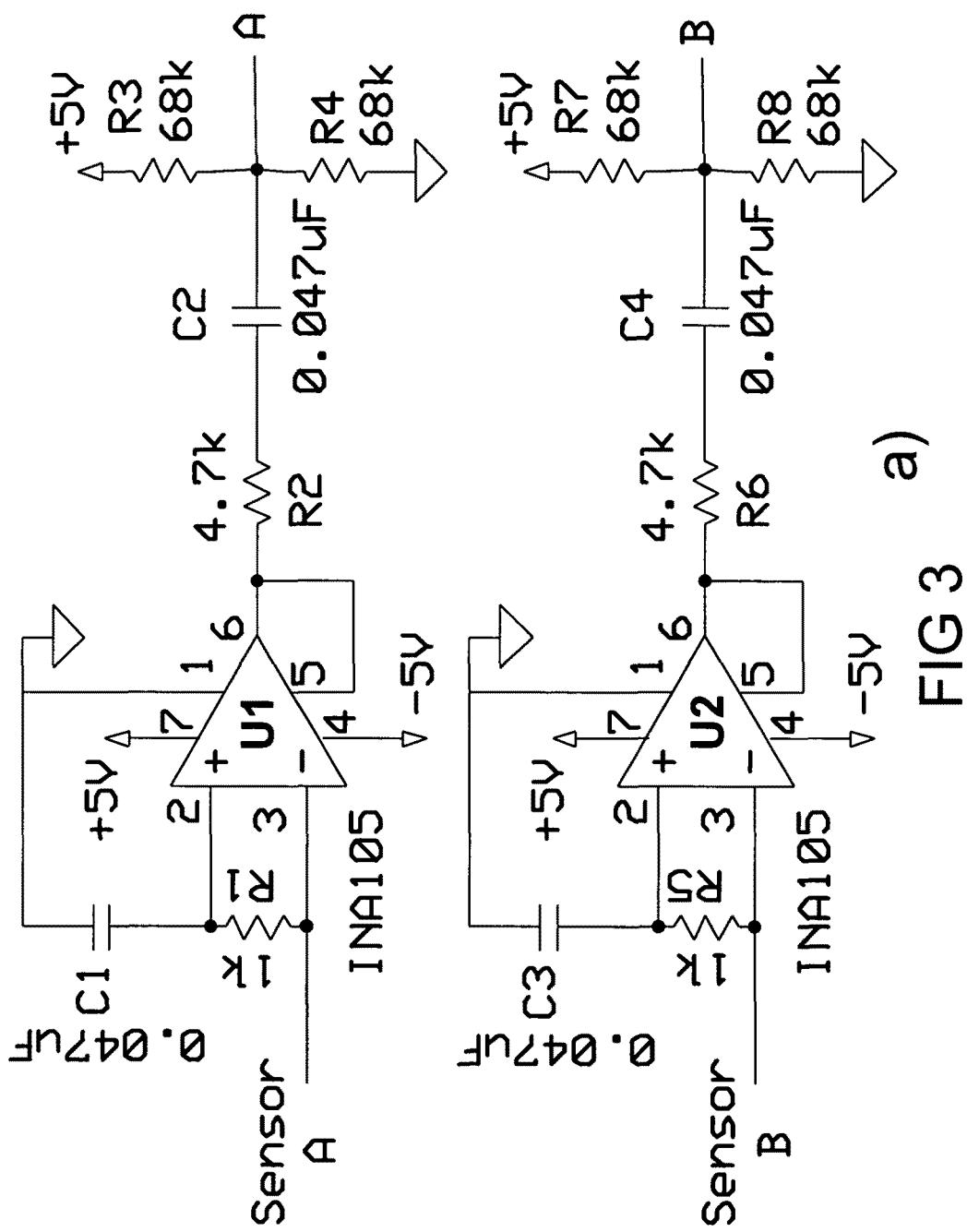
FIG. 3a) and FIG. 3b) Together show the preferred embodiment MCS FET array signal conditioning circuitry is this application.
FIG. 3c) Shows a single element broad band E-field sensor system using FET with voltage divider bias.
Figure 3:
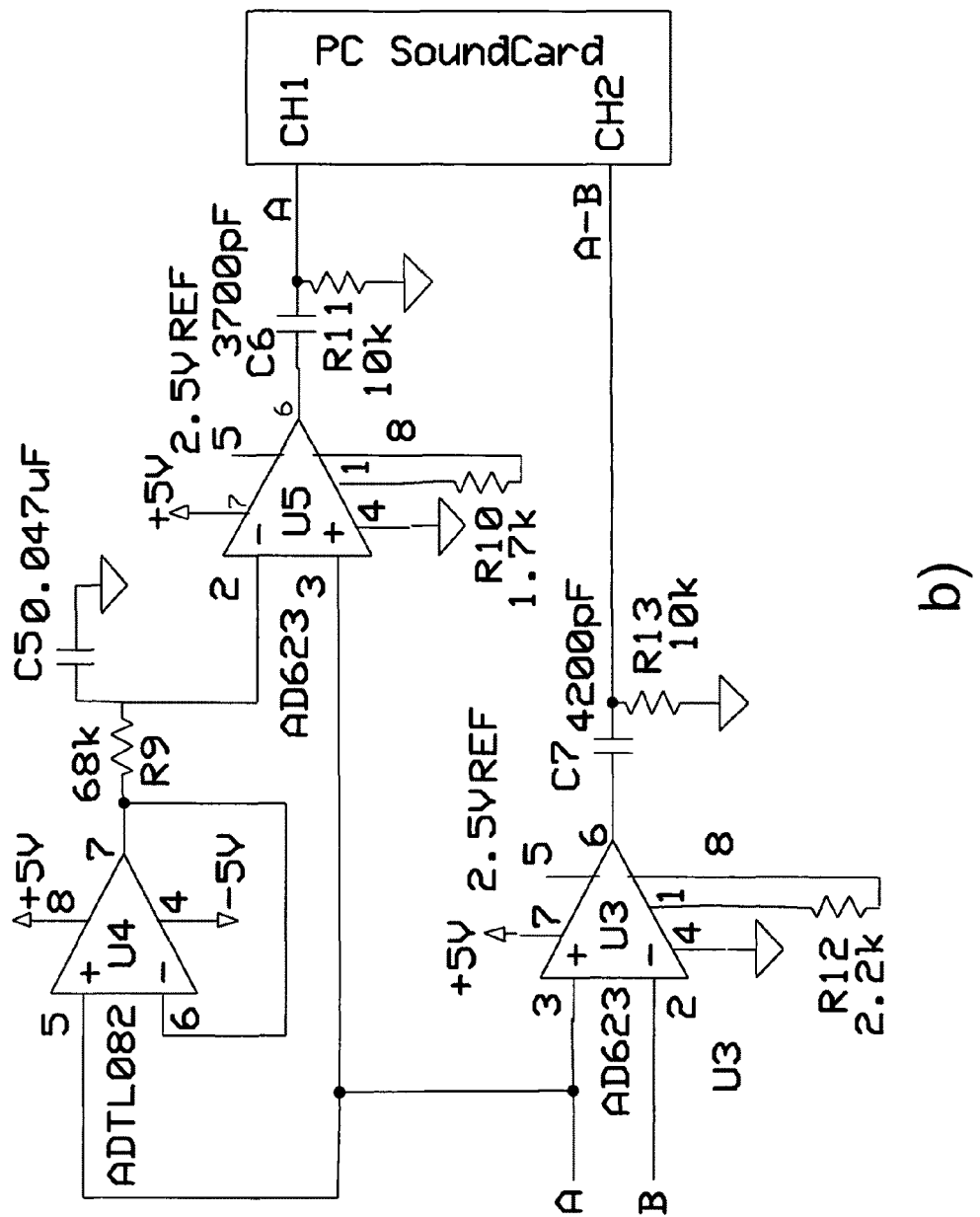
Figure 3:
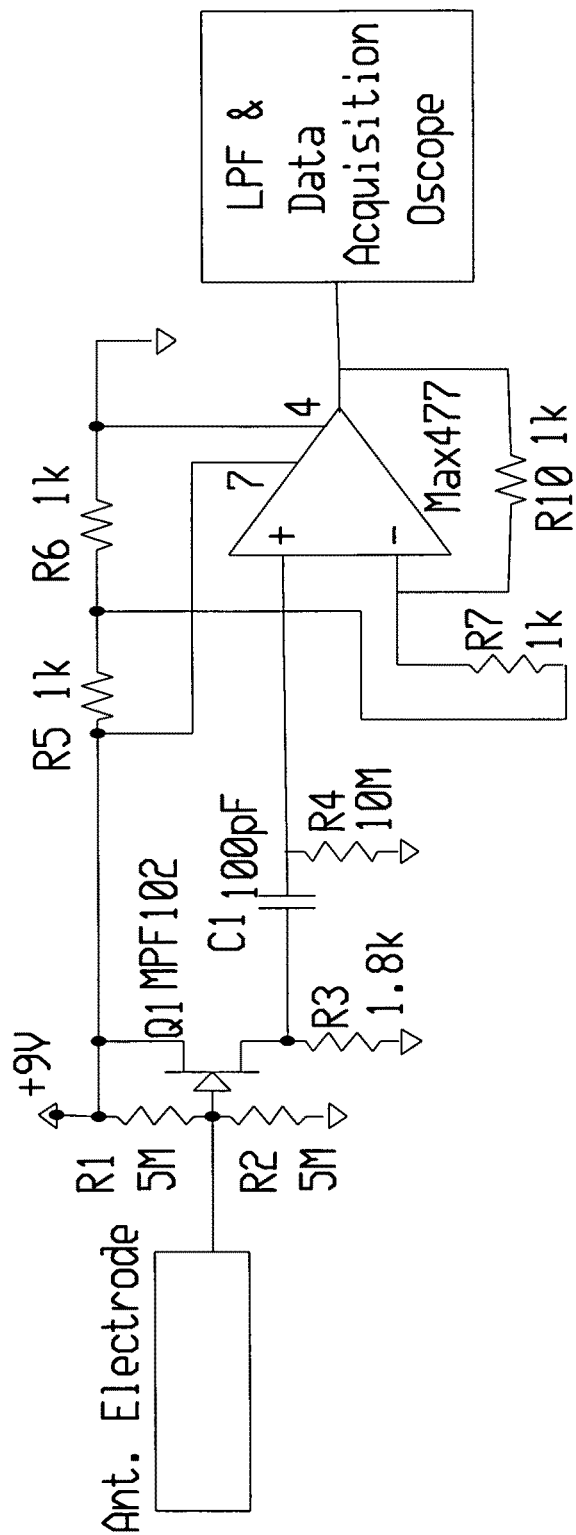

One, explanation is the capacitance between the sensor electrode and the reference electrode needs to be significant enough to allow battery level voltages to control the DC bias. When using small sensor electrode near the display monitor, the reference electrode was that of that of the ground plane of the face of the video display. This was observed in 61/070,099 with both an opamp and a discrete JFET E-field sensor having floating sensing electrode. As those sensors moved back from the display 10 inches or more, the reference bias was no longer provided. That is why addition reference plane was used in 61/070,099 to allow for detection further from the display. Also note, the floating gate FET was that of FIG. 3b with the bias resistors attached to the gate removed.

However, another difficulty to be discovered was the sensor was too sensitive to low frequency quasistatic fields like footsteps to make an MCS. This is why as these could be seen during power up before the full sensor saturated, or when touching the sensor electrode to ground then watching. Henceforth came the idea in the future of switching the gate voltage on the sensor element to maintain bias as shown in FIG. 1b) and FIG. 1c). Foot steps and movement of static charge and triboelectric charging of moving objects were detected as DC transients at times move between the voltage rails of 0 to 5 volts. Thus the bias would change with foot steps and the AC amplitude changed. This means two things. One the E-field floating gate amplifier is not linear and also was seen to total turn on and off with foot steps, and the AC gain would change. The nonlinearity is not much of a problem for FM waveforms and is a problem for amplitude dependent communications such as a MCS. The turning off is a problem to receive any kind of modulation.

The floating gate FET without bias control operates mostly a switching amplifier when steps were present. The operating point of the FET changes with the potential on the gate. This helps to explains why Beaty's electrometer had a sensitive DC sensor to foot steps where the E-field from the footsteps would turn on and off the LED.

Note that both 61/070,106 and its predecessor provisional application describe a resistor biased JFET transistor amplifier in FIG. 3b. The subsequent filter and amplifier is made for high frequency detection of E-field horizontal 30 MHz bandwidth video signals from a video display unit such as a CRT or LCD display. At these frequencies the display acts as E-field active source. The signal level does not decrease noticeably like at low audio frequencies when the body was in contact with the common and the hand is approaches the sensor. These technologies are discussed in both provisionals 61/070,099 and 61/070,106. Non-the-less they both show bias resistors were contemplated but not directly pursued for passive MCS systems because bias resistors sacrifices sensitivity and adds wiring complexity. The voltage gain difference was found from the bias MCS sensor to a non-biased IC to be about a factor of 10.

Recognizing the floating gate problem, Cehelnik in 61/070,106 introduced a 2D octagon sensor array for portable use.

At least six practical problems were encountered with the octagon design for making an array for a MCS. One, the frequency response was extremely low, and foot steps and static charge from shirtsleeve set off the sensor and distorted the amplitude response. Two, was the limitation on the microcontroller's analog-to-digital converter (ADC) sample rate and processing speed. We were trying to get all sensor elements sampled and signal power levels measured. To get accurate power levels we needed more than a few cycles of the background 60 Hz, and this meant the update rates were limited to 20 Hz assuming we sampled all 8 elements simultaneously for say 4 cycles of 60 Hz background. This put demands that a low cost processing system of the CY24C784 microcontroller could not meet. Three, the background AC field of a portable system was not necessarily well controlled if the pod or body is near other electrical field sources or ground planes like monitors. Four, the power level was not linear with distance. Four, the size of the array, and the layout was large. Five, there was no real way to scan in angle and direction toward the user. Horizontal scan direction finding could be done as in Zank, et. al. Six, a useful change in range algorithm did not exist, the range signal was not linear.

Thus what is needed is a solution to make a MCS array to overcome the practical limitations of the above paragraphs.

Detailed Discussion of Technology

In this application, Cehelnik teaches how to E-field image and to proximity detect and track in 3D the motion of a body using an array of sensors. Cehelnik's previous patent applications taught how to use a JFET integrated circuit opamp with a buffer configuration to make an E-field sensor. Now we discuss how discrete JFET or MOSFETS transistors are used to facilitate miniaturization and fabrication of arrays of closely spaced E-field sensing elements.

Previously, Cehelnik has shown that JFET input type operational amplifiers having an electrically floating high input impedance mode provides superior E-field sensitivity allowing for improved proximity and imaging. However, to control the gain of the sensor, a DC bias electric field needs to be generated at the sensing element or antenna to control the DC output. The bias electric field is provided by an adjacent electrode or "reference electrode". This was discussed by Cehelnik the AC & DC coupled E-field sensor application, and in the "Method of Physical Approach".

Cehelnik has shown in the previous applications that by changing the bias field by disruption or conduction from a proximate body results in a change of gain of the amplifier, and facilitates detection. Alternatively to maintain or control the frequency sensitivity of the amplifier or the overall gain of the amplifier, or both, Cehelnik has shown that by adjusting the bias to the input of the amplifier, we can achieve a desired operating point or gain. Even a reference electrode with a feedback network was shown in the previous applications to facilitate control and maintain sensitivity. It was also shown that it was useful to control the AC gain of the sensor by using the fact that these opamps had a DC offset output related to the bias of the JFET input electrode. In fact, here we state the DC and AC gain depended upon the DC offset.

Cehelnik has stated in the previous applications and again here. It is significant to an E-field sensor sensitivity to remove the bias resistor network to the input of the amplifier to preserve input impedance. However, the input is electrically floating, and there is no device control of the gain, the background DC field sets the gain of the device. The amplifier gain is floating, and can even be turned on or off depending upon what the electric field is near it.

The sensor using the floating electrode arrangement or now called "floating gate" since the gate of the input of the JFET is electrically floating. This configuration is not stable by itself because the gain is not definite when the sensor is moved or the background changes.

Cehelnik repeats here that it is useful to make the amplifier operated in a controllable way, by having a reference electrode that provides an electric field to the sensor input electrode. The reference electrode provides a dominating electric field to the sensor. The floating gate configuration presents the input impedance of the FET device to the sensing electrode. It was shown that the DC output was controlled by an external electric field or bias field produced by a reference electrode. The bias field can be generated by natural fields like that of the earth's electric field at the sensor, or by equipment or a source field proximate the sensor. It was also shown that the AC sensitivity was controlled by the DC output or voltage offset of the amplifier.

Cehelnik has also shown that filter in the front of the buffer amplifier can be made to trade with a floating gate sensor at the expense of sensitivity. However, there are times when the frequency content of the desired signal is best filtered with a bias of the gate with a shunt capacitor, to pass only DC, or a shunt resistor when no reference electrode or constant is available, or the case when a shunt resistor and shunt capacitor are both used to filter the AC entering the amplifier. For example, a 1 uF shunt capacitor at the front end of the MCS sensor results in a DC response of the amplifier and is useful for sensing slow motion creating low frequency fields like foot steps or plastic wand motions. Such a filtering capacitor can also be in a sensor with a buffer amplifier not having a bias resistor.

In previous patent applications, the E-field sensing using opamps were discussed. A difficulty with using the opamps in arrays is the cost, and placement of such opamps in an array. To detect the electric field a precise locations the sensing electrode or antenna needs places at the spatial location. Any extent of the antenna can result in detection of electric field signals at the extended location.

To make arrays it is desirable then to have E-field sensors or buffers located a close to the electrodes as possible. If we embed E-field sensors in a computer screen or finger sensing pad we can see the required level of integration with small parts can easily exclude the use of an opamp chip. Cehelnik has indicated that multiplexing elements with E-fields sensors is of value. It is not obvious though, how to meet the requirements of packaging and performance, and update times.

A problem with multiplexing the antennas is the switches have to preserve the high input impedance of the antenna, and the switches have to be located near the location to be detected. Cehelnik, has discussed and shown that it is possible to shield part of the antenna electrodes where sensing is not desired. This helps in routing wires from sensing electrodes to a multiplexer. However, the multiplexer has to have a high input impedance for sensitivity, and if not, then the detection of the signal on the sensing electrode is greatly diminished.

Generally these type of analog multiplexers do not exist. However, if sensitivity is not a critical driver, for example in touch screens the multiplexer can precede the E-field sensor element. Touching is on a flat panel is a 2D process, and gestures can be detected. Cehelnik, shows here that using a 2D grid we can make a touch or screen by simply multiplexing the inputs of a cross hatched array into an E-field sensor.

Another need is to find a way to switch signals from a multidimensional array of E-field sensor signals. If an opamp is used at the location of the E-field sensor, positive, negative, and ground power lines are needed, along with output line is needed, and the input antennal. This is a total of five wires that need routed to each E-field opamp sensor. An N×M 2 D array has N*M output wires. It quickly becomes prohibitive to wire for high sensor count densities. It is easy to see this is a major problem to achieve a video display type resolutions.

Also, the power consumption is a concern. It is generally necessary to conserve power and extend battery life on portable E-field sensor arrays. In an array, it becomes at time necessary to switch off the sensor amplifiers to reduce heating and power consumption.

Using the least number of sensors in arrays is necessary to reduce complexity and power consumption. Sensor counts of N×M can be too many sensor elements that exceed cost and complexity of the devices. In motional command applications for portable electronics, it is shown herein how to reduce the sensor count to N+M sensors. In imaging applications, we can reduce the number of elements needed by scanning a single element mechanically over a 2D grid of locations, or a 1D line array over a 1D grid of locations perpendicular to the array. However, in a camera type operation a 2D array is required.

To reduce sensor processing circuitry, signals from each element are measured at different times, or a difference measurement is made between elements at different times. This is time division multiplexing where the scan time is divided by the sensing time on each element. For motional command applications, the time of scan of the array sensor elements is related to the duration of the motional command. Typical video refresh rates are sufficient, and even less. For Imaging, the duration of the scan depends upon how long the body is present or can remain stationary.

For a MCS the other issue is to detect the person using an array. Cehelnik has shown by applying a potential to the body the E-field sensor can sense the DC value, and also the AC signal. To detect the position of a finger, stylus or control object or surface, the potential that the sensor input uses as the reference is applied to the body. The current is limited to keep it safe. The DC or AD signal is applied to the body, because the corresponding change in the detected DC or AC signal is used to indicate proximity to an element. These detection and modulation modes of operation were shown with opamps and will be shown herein how to use them with the disclosed discrete FET(s) E-field sensor arrays. To solve the stated problems in array assembly, herein is discloses an apparatus of E-field sensors containing a discrete JFETs or MOSFETs. The discussion also applies to the making and use of single transistor E-field sensors useful where cost or long wire routes are an issue or size is an issue. The output of these sensors are followed by amplifiers, and thus form a complete E-field sensor such as in the opamp version, and all the technology of the previous applications apply to this composite type device. In some instances, the FET sensor provides significant output and thus can go directly to the detection circuitry and signal processing.

This CIP Application Further Describes Invented Sensors and Array

Figure 12:
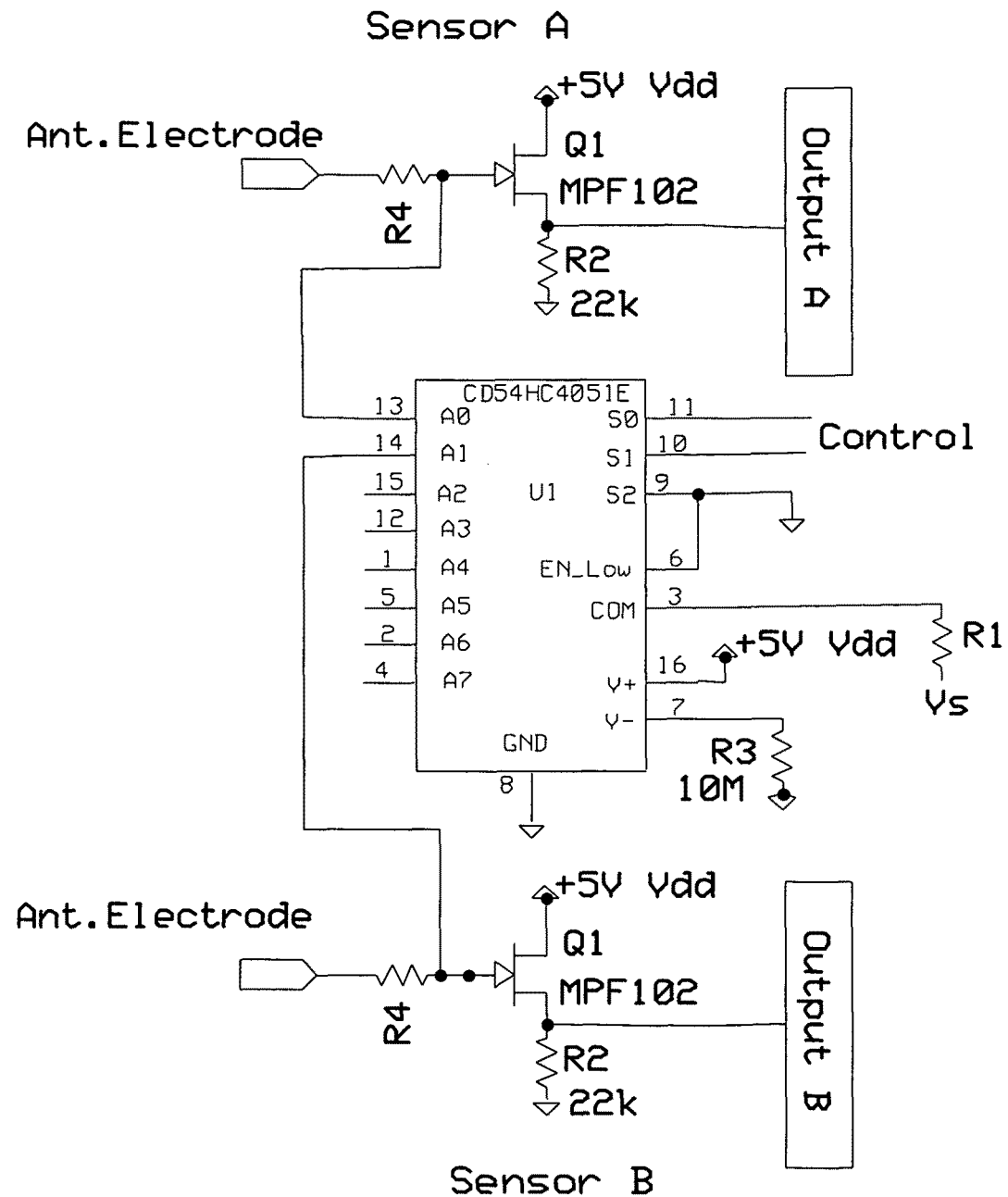
FIG. 12—Describes a more sensitive E-field sensor array implementation that switch electronically the bias connection to FET sensors using an analog multiplexer. It also shows a dual sensor in an array that allows a differential measurement between Output A and Output B to reduce common mode signals. It offers low frequency response and better linearity than a fixed gate bias resistance R1 described earlier such as in FIG. 2. The switch time allowed R1 to connect to sensor A and B for 20 ms. Then it held them both disconnected from R1 for several seconds. The time intervals are easily shorted or increased as needed by the designer. After the connection is made there is a transient for 100 microseconds or so that is low frequency. Waiting after this transient to sample the signal is an option for low frequency analysis, but make little difference for high frequency signal in audio range and above. The switch bias mode has best gain essentially independent of the value of R1. Thus zero Ohms is simplest implementation, and VS is at common ground potential. However, we used R1 at 10 MOhm to allow us to stop the switching an have a steady state connected R1. Zero Ohms works best from a parts count perspective. The gain is 7-10 dB more than a connected R1, and the signal to noise ratio increase 5-8 dB. There is insignificant 60 Hz intermodulation that are present when a connect R1 is used.

FIG. 12—Describes a more sensitive E-field sensor array implementation that switch electronically the bias connection to FET sensors using an analog multiplexer. It also shows a dual sensor in an array that allows a differential measurement between Output A and Output B to reduce common mode signals. It offers low frequency response with DC sensitivity and better linearity than a fixed gate bias resistance R1 described earlier such as in FIG. 2. The unite tested with no R1 and Vs=0 under switched bias showed 3 dB low frequency cutoff around 3-5 Hz, and high frequency response out to 30 kHz. The upper limit was limited by test equipment, and it is reasonable it extends into 100 kHz and even MHz.

The switch time allowed R1 to connect to sensor A and B for 20 ms. Then it held them both disconnected from R1 for several seconds. The time intervals are easily shorted or increased as needed by the designer. After the connection is made there is a transient for 100 microseconds or so that is low frequency. Waiting after this transient to sample the signal is an option for low frequency analysis, but make little difference for high frequency signal in audio range and above.

The switch bias mode has best gain essentially independent of the value of R1. Thus zero Ohms is simplest implementation, and VS is at common ground potential. However, we used R1 at 10 MOhm to allow us to stop the switching an have a steady state connected R1. Zero Ohms works best from a parts count perspective. The gain is 7-10 dB more than a connected R1, and the signal to noise ratio increase 5-8 dB. There is insignificant 60 Hz intermodulation that are present when a connect R1 is used.

Figure 13:
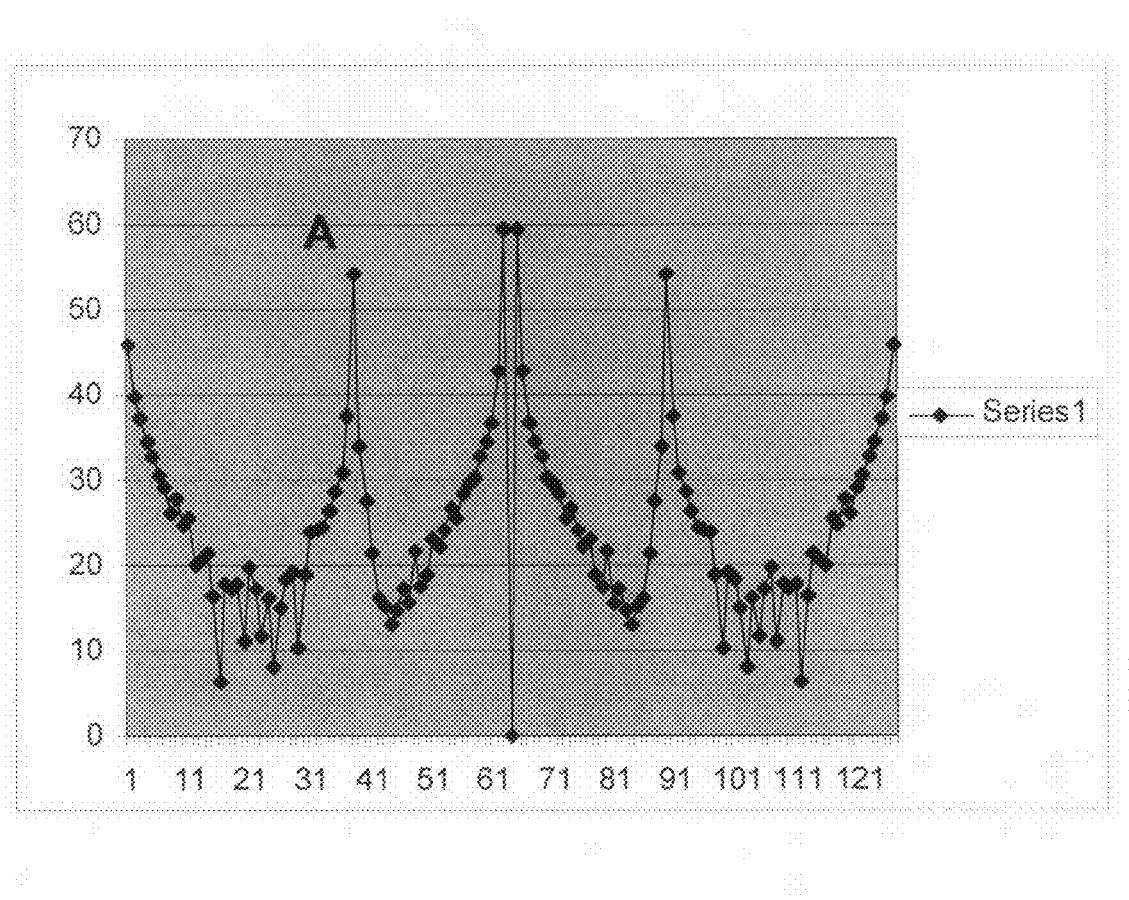
FIG. 13—Shows Low frequency response of 36 Hz signal from a hand located 4 inches away indicated by marker A obtained with a 128 point FFT for outputs A and B from FIG. 12 sampled directly into a differential 14 bit Analog to digital converter of a Cypress Semiconductor PSOC CY8C24994. The sample rate was 121 Hz. The ordinate is in dB, and abscissa is in Hz.

FIG. 13—Shows Low frequency response of 36 Hz signal from a hand located 4 inches away indicated by marker A obtained with a 128 point FFT for outputs A and B from FIG. 12 sampled directly into a differential 14 bit Analog to digital converter of a Cypress Semiconductor PSOC CY8C24994. The sample rate was 121 Hz. The ordinate is in dB, and abscissa is in Hz.

Figure 14:
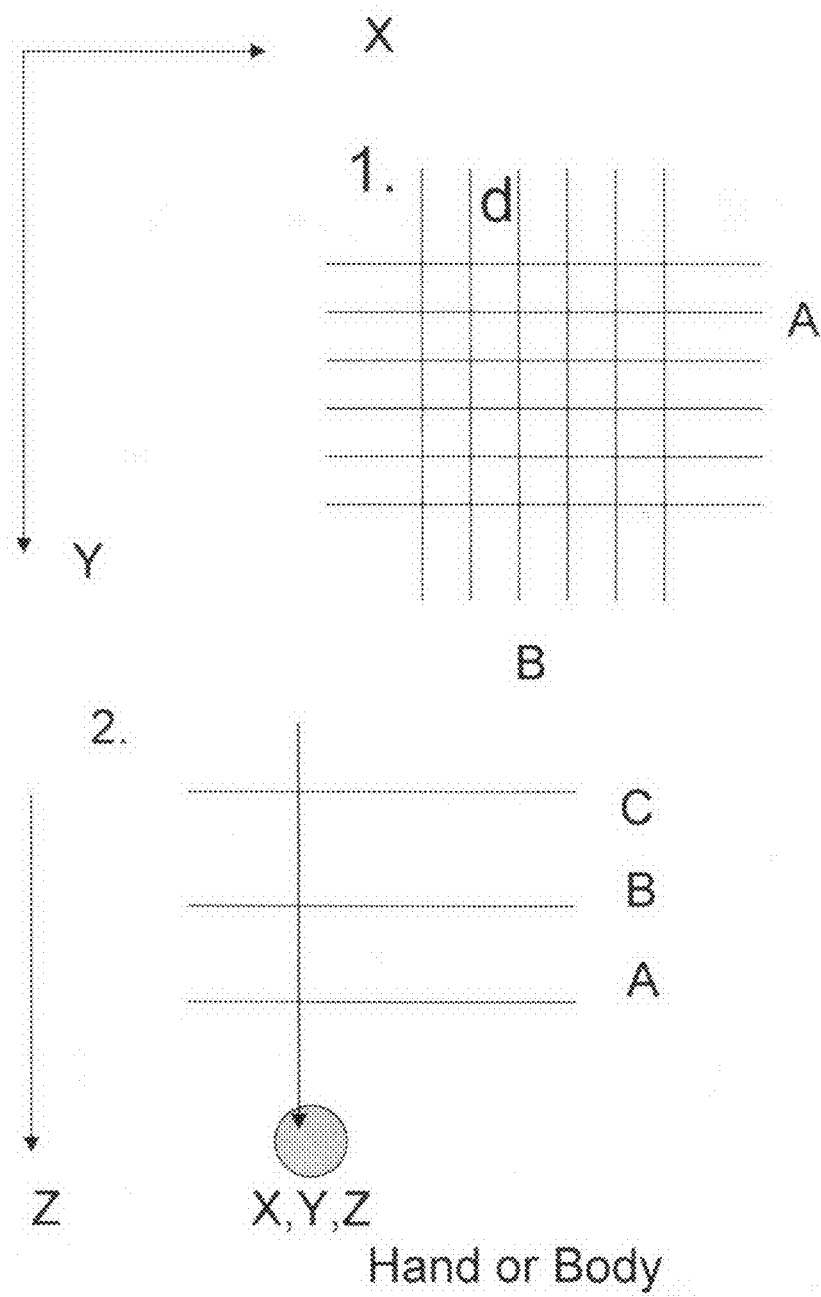
FIG. 14—Shows cross array elements for sensor A and sensor B to measure locations of a hand or body relative to sensor panel. 1 shows front view, and 2 shows top view. C is a reference element or plane that allows sensor A and sensor B to measure their output relative to an E-fields sensor connected to element C. The gain in each channel A, B, and C, can be adjusted for size of elements, and signal processing is used to balance the measurements of A−B and a representation of the average of A and B, such as A only or some other metric. Thus we are presenting a proximity sensor that detects X,Y of the body that has a source signal either generated from a voltage modulator held by the person or near by that couples to the persons body or a received from the background signals, such as fluorescent lights, main lines signals 50-60 Hz, or monitor refresh signals, or radio. The elements in A array and B array are switched to find the elements having the larger signal. These elements locations correspond to the X,Y intercept point for the body. The Proximity or range to the sensor array from the body are indicated by the range metric or signal strength on both elements. Changes in range, and X, and Y positions with respect to time indicate speed and velocity that are easily measured by the time between measurement updates.

FIG. 14—Shows cross array elements for sensor A and sensor B to measure locations of a hand or body relative to sensor panel. 1 shows front view, and 2 shows top view. C is a reference element or plane that allows sensor A and sensor B to measure their output relative to an E-fields sensor connected to element C. The gain in each channel A, B, and C, can be adjusted for size of elements, and signal processing is used to balance the measurements of A–B and a representation of the average of A and B, such as A only or some other metric. Thus we are presenting a proximity sensor that detects X,Y of the body that has a source signal either generated from a voltage modulator held by the person or near by that couples to the persons body or a received from the background signals, such as fluorescent lights, main lines signals 50-60 Hz, or monitor refresh signals, or radio. The elements in A array and B array are switched to find the elements having the larger signal. These elements locations correspond to the X,Y intercept point for the body. The Proximity or range to the sensor array from the body are indicated by the range metric or signal strength on both elements. Changes in range, and X, and Y positions with respect to time indicate speed and velocity that are easily measured by the time between measurement updates.

Preferred Embodiments

The switched bias E-field sensor or plurality of sensors used in an array where is useful for measuring small electric potentials due to electrical signals. Measuring differences between the sensors allow for common mode signal to be reduced such as 50-60 Hz mains, and also static charge from objects and bodies moving.

The closer two elements the more the sensor detects near field gradients. Far from sources changes in potential change less with range, and thus appear as common modes.

We used successfully 4 inch 22 gauge wires separated by 1 inch on the sensor described in FIG. 12. The external noise from static or footsteps cancelled well when using a difference measurement from output A and B. To detect footsteps well use a signal element.

Moving the elements farther apart allows sensing larger changes in potential due to an electric source. Of course gaining up the difference can also help see the difference if electrodes are close, however good channel balance is needed.

The bias sensor is good for miniaturizing sensor because not much amplification is required. By using a printed wire board antenna, the 4 inches antennas are easily folded on a planar trace. At least two antennas are contemplated attached on a substrate circuit board material ¼ of inch square or so, either both on one side or on opposite sides. Different geometries of electrodes are possible by those working in the art but are covered here in this invention. The dielectric can actually help make the elements sense different fields.

By using the switched gate Sensors described here, we can make a small sensor with and ADC converter and USB interface using a PSOC CY8C24994.

It is know that brain activity causes low frequency 1 Hz to 150 Hz or so, and a switch bias sensor comprised of a measurement system is described. EEG use typical 16 electrode configurations, and these electrode sensors are well suited for low noise amplification using a low noise difference amplifier like the LT1167 prior to entering and analog to digital converter. It is also realistic to note that the switched Gate can be used in other combinations of amplifiers like the Cascode amplifier known for its low input capacitance. Comprising the cascade amplifier with the switch gate FET is thus contemplated, or other amplifier configurations.

The switched bias sensors can also be used in replacement of fix bias FET described elsewhere herein in motional command system arrays.

FIG. 14 shows another preferred embodiment of this invention is the antenna or sensor array configuration using the range metric is more general. To make a flat panel TV or monitor display we use a panel of horizontal and vertical elements. They can extend across the height and width of 17 in LCD display on a clear covering material. Making the elements small in thickness and width 0.020 in to 0.006 in allows low capacitance to the ground plane. Separation between the element of depends can be ¼ inch to inch for practical applications without many microassembled elements. The resolution depends upon the resolution and the number of multiplexed sensor required. Larger screen displays may need separated into sub-panels. However, the number can not be so large that the front array obscures the bottom.

The screen functions as a touch screen by picking up background signals more so on the intersecting horizontal and vertical elements at the touch locations. It also functions as a touch screen and a motion command screen when using a source modulator, such as one from about 3-9 kHz, when sampling at 100 kSa. Other frequencies of transmission are possible but must be able to filter out the alias horizontal refresh rate, and the vertical refresh signals too. Also, as discussed by Cehelnik elsewhere, the E-field sensors can respond to an increase or decrease of AC or even DC background depending upon design to detect the body state of ground, common, or source voltage.

Now the screen senses the proximity of the hand from its intersection point. The same algorithm describe previously is used access the difference signal between the horizontal and vertical elements, and a representation of the average to get a range metric from the screen. Now there is no need to look for the azimuth and elevation angles by sweeping between just vertical or horizontal arrays. This simplifies. In the later case, it is also found that using a single element in the top array, prevents the obscuration of signal to the bottom array.

The wires for the array are made from transparent electrodes like those used in the LCD displays. Also the sensors are mounted on the edge of the screen. It is easy to use switch gate sensors as well, as this can be multiplexed from the video signals as controls.

Motional Command System with Active Source

The preferred embodiment of this invention is disclosed in detail that shows how to make an active MCS using E-field sensor arrays operating over the audio frequencies from about 500 Hz to 5000 Hz.

The solution is presented herein it to use a shunt bias resistor at the gate input, of a JFET sensor so it is not sensitive to foot steps. The trade in sensitivity was needed to avoid interference.

The active source becomes the hand or body part of a person when a person's body is in contact with a voltage source voltage in the specified frequency range. Alternatively, the person may hold or have attached to their body a source producing an E-field source signal with frequencies in the specified frequency range. In this case the object containing the E-field source is the controller. Alternatively, the person may be AC coupled to a source that they approach or wear, and the control surfaces becomes their hand or part of their body. Individual sensor elements and pairs of sensor elements then are used to receive audio signals directly through air.

The preferred embodiment uses simultaneous measurement of single and dual sensors to allow for directional sensing, and to provide a metric for processing linear responses with distance. The system requires a single sensor element signal, and a difference signal between two sensor elements in the array. The single sensor element was one of the two elements used in the difference. The array was also placed on top of a ground plane to control the vertical component of the electric fields adding to improved directionality.

The active source was a 2 Volt peak-peak audio signal having frequencies in the approximate flat passband range of the system from 2 kHz to 4 kHz. The active signals were produced from a RealTech sound card internal to the motherboard of a Windows desktop computer. The desktop computer had its chassis connected to earth ground, and thus the common on the sound card output too.

The digital signals and processing was done in real time on the same Windows desktop computer and the range metric was displayed. A Soundblaster Audigy sound card running in 16 bit mode was used to capture the data. One ADC channel of the sound card was connected to signal conditioning circuitry that conditioned the voltage signal from a signal element. The remaining channel was connected to the signal conditioned circuitry that represented the difference between two elements in the array.

The data captures were done using Windows Multimedia library. A multithreaded application was coded to return to the main application as soon as a soundbuffer was full. The data was captured at 96000 samples per second, and simultaneously on both channels for 4096 points. We were able to get about 23 Hz frame rate. Faster frame rates are possible when capturing data into continuous buffers and by reducing the capture size. It is follows that by reducing the capture size to 512 points, and multiplexing 8 sensor elements that we can also get a 23 Hz frame rate. The frame rates are nearly ideal as taken on the desktop above. Other hardware can run faster or slower, for example a newer notebook HP Pavilian dV-7-1183d could only get about half the frame rate running the same code, but it did not have the high performance Soundblaster Audigy sound card, and it was running Centrino 2 mobile processor P7350 running at 2.0 GHz.

The signal processing and detection is done by bandpass filtering the signal using a finite impulse response FIR digital filter. The filter was needed to eliminate fluorescent lamp noise. The lamp noise from circular tubes and convention incandescent bulbs is broadband incoherent noise from about 40 kHz to 44 kHz. The signal energy was in the capture bandwidth of the ADC. In fact, we have been able to use a fluorescent lamp as an active source. If we do not sample at the 96000 samples per second, but at 48000 samples per second, the fluorescent noise aliases into the audio band. Other tones from video display are observable, such as horizontal refresh rates. It is contemplated for audio E-field transfers to run a 60 Hz Cascaded integrated Comb filter notch filter to clean up audio. This requires decimation of sample rate and was simulations shows expected 30-35 dB suppression of 60 Hz and harmonics are possible.

The signal conditioning and frequency of operation of the system was an important concern in the preferred embodiment of the MCS. To eliminate interference from static and foot steps, we had to operate the MCS sensor with low frequency corner of the E-field sensor elements higher to about 2 kHz. Also efforts were made to reduce common mode signals of the mains of 60 Hz and its harmonics by high pass filtering and applying differential amplifications. The differential amplifiers are used on each sensor for this point.

The frequency of the active source is also chosen high enough to allow a measurement of the received signal processing power by having more cycles per capture or observation. For example, at 3000 Hz and a capture time of 5.333 ms, we get very close to 16 cycles. The use of multiplexing of elements means we have less observation time on an element to get the same frame rate as a single element. Also the switching frequency that switches the MUX must not interfere or coincide with the frequency of the active source detection.

The signal conditioning in the preferred embodiment is done relatively simply and inexpensively. This does not preclude other implementation that would trade a slower ADC sample rate to conserve power, for an analog filter anti-aliasing filter. Also there is room for design changes in power supply voltages, and design trades based upon component cost and counts.

Most of the design was mostly driving by a single sided positive supply requirement. However, doing so for the MUX made for the need to have additional DC compensation circuitry. Since in the presented version the MUX 4051 is using only a positive supply, the E-field sensors are DC coupled though the MUX. Differences in DC offsets appear as AC signals at the switching rate of the MUX.

Thus a signal conditioning circuit using a DC instrumentation difference voltage amplifier INA105 was introduced to subtract off the DC and minimize the amplitude of switching frequencies. This circuit is not for the purpose of allowing further DC amplification and is only required or an alternative AC coupled design when switching the MUX. Using a positive and negative supply with the MUX allows for capacitive coupled outputs from the sensors and such a design has been contemplated. Using a positive and negative supply with the AD623 also would eliminate the need for biasing up the AC with a DC voltage. The use of an AD082 was used to eliminate the DC offset.

Maxim even makes a stereo headphone driver MAX4410 that eliminates the need for coupling capacitors that seems like it could be used at the output of the MUX, and maintain constant near zero DC output as the MUX switches. Then the signals could be driven directly into the differential amps. Those skilled in the art can find other desirable configurations, such as capacitive coupling, adding additional pole filters etc., but such design changes are considered still covered in this invention.

Now we discuss the performance of the disclosed FET array MCS. The source signal was routed to one hand via a shielded audio cable. The contact was held in one hand at the person's side. The described MCS system was able to detect the other hand at an angular location and obtain linear range changes due to the motion of a hand at distances of 6-8 feet. About half of this distance is obtained when a 10 MOhm resistor is placed between the active source and the body. The current in this case at most would flow through the body is 0.5 microamps. It was also found that just by placing the audio signal onto a plate of about 4 in×4 in, there was no need to physically touch the active source electrode. Just by moving one hand near it to about 4 inches away, and reaching with the other hand toward the sensor array we could pick up the source signals with the MCS array easily at arms length away about 3-4 ft.

Additionally, when the active source was provided by a notebook computer powered on batteries, thus the body potential was floating and the MCS was still able to receive the signal. The reverse was also found true. This was when the active source was from the desktop computer and the MCS E-field array was run using batteries while connected to the portable notebook sound card to capture and process the data.

Hence, we confirmed two things about the wireless and portable operation. One the usefulness of having portable modulator that is carried and even possibly AC coupled to the body, such as in a phone or other wearable device. Two, the system works as portable battery powered MCS array systems.

These results make possible the fact that multiple sources can be located on the body having distinguishable modulation characteristics and be detected by the MCS array. Hence, making it possible for the system to have the ability to determine which hand or fingers or body parts are located relative to the sensor array and relative to each other.

To take this further, and gain proximity relation between small body part like the fingers of one hand and those on another, individual E-field sensor elements and active sources are contemplated to be placed on the fingers, perhaps just at the tips or even at the tips and knuckles. They could be housed in a glove. The E-field receivers can then even transmit data back to a processor via E-fields or radio communication to make for a wireless connection. The relative distance between fingers is obtained by processing the signals exchanged between active sources on the fingers and E-field receivers.

In fact, one sees it is possible to have a transceiver made from active sources and E-fields sensors that are approximately collocated or self contained with in a device that attaches to the point of interest for tracking. Speech recognition, or Hidden Markov Models or other statistical classifiers can then be used to sort out motions and recognize signals such as those is American sign language or other conveniently developed motional language for computer recognition and control.

Detailed MCS Array Method

To make arrays with multiple sensors a wiring method and switching method is needed to reduce cost and size. Herein we show how to make and use an E-field array with from a cross hatch of line arrays of antennas shown in FIG. 4a. Line or strip or stripe arrays are used as names here interchangeably and contrast pixels arrays. Pixel arrays are a 2 dimensional 2D matrix of dot sensor like those in LCD display. The benefits of the line array technology presented are:

1) The number of sensors is reduce to M+N from M×N.

2) The sensor elements can be larger in area making for higher sensitivity 3) 3D process is achieved in flat panel array or cylindrical arrays.

4) Touch screen capabilities are also possible the E-field array

5) The location of the FET transistors can be at the edges of panels and only transparent electrodes are needed over a video screen. The screen can be divided into quarters and the FET transistors can be located along a perimeter.

The sensor elements of the array need to have a sensor proximate the location of the electrode so it can sense the electric field at the point of the electrode. output from those sensors needs wired to the detection circuitry. Generally, the wiring not only adds noise but adds capacitance reducing the sensitivity. Another thing is the sensor has to have enough sensitivity for the size of the sensing electrode. The facts along with added complexity of wiring into a small panel or an LCD video screen or sensor pad make the task not trivial.

MCS Discrete Transistor) FET E-Field Sensor:

FIG. 1a shows FET floating gate E-field sensor element with E-field bias example. The sensor is a FET configured as common drain or source follower amplifier with a floating gate. Other amplifier configurations are possible but may require more components such as a common source amplifier requires a bypass capacitor. The output voltage of the device is representative of the potential applied on the antenna electrode.

The FET in the element acts as a buffer amplifier with high input impedance is extremely sensitive to the potential of the gate electrode. To establish a stable operating point for the FET amplifiers, a reference electrode is placed proximate the gate. The electric field provided by the "reference electrode" causes a potential on the gate. By making the potential of the reference electrode set relative to the source potential, the bias voltage is controllable. The big advantage with this method is several. One, the very high input impedance of the FET is the input impedance of the amplifier. Another is the part count of biasing the FET is reduced, and this greatly reduces the complexity of a high density array of sensors.

The conduction current in the FET amplifier, and also the gain, both DC and AC depend upon the "bias voltage" established between the source and the gate. For N-type JFETs, and depletion type MOSFETs, maximum gain is achieved when the $V_{GS}$ bias is zero. Those familiar with the specification sheets of the FETs can find the desired operating bias potential for maximum sensitivity of the E-field sensor. To achieve an operating point, the reference electrode potential is adjusted to get a desired drain current. The modulation of the bias voltage due to a DC field incident on the sensor electrode results in a proportional change in the drain current or voltage at the amplifier output.

The floating gate sensors can at times be difficult to exercise control of the bias with a reference electrode if the sensor antenna area is small, or the background potential has too much influence. This is some cases when using floating gate operation amplifier circuits too. A novel solution presented here is to use a switching bias gate technology. FIG. 1b shows a switched voltage or capacitor arrangement for a single FET transistor E-field sensor. FIG. 1c shows a switched voltage or capacitor arrangement for an opamp E-field sensor. It is has been observed by Cehelnik that the circuit in FIG. 1c would float away in about 10 seconds to the rail. Thus by switching in a desirable bias voltage, about 2.5V for the circuit in FIG. 1c, we got an AC voltage gain improvement by a factor of 10 compared to when the device stabilized. The gain then decreased to its steadystate after about 10 seconds. For low frequency application a few picofarad shunt capacitor gives this time constant for a 10 GOhm input impedance. This is reasonable because the circuit was mounted with a floating electrode on the underside of the printed wired board.

Switching attempts on the FET circuit in FIG. 1c gave shorter times in the seconds but the effect was the same. We tried to put 0 Volts on the gate of the circuit in FIG. 1b and 2.5 Volts on the gate in circuit FIG. 1c.

If the time constant is made slow enough to capture the signal of interest, this new bias method is useful for E-field sensing. Also, by refreshing the bias at a refresh rate, it makes the sensor have an effective frequency response higher than the refresh frequency. This is because slow frequencies will be cut off at the input because the input will be pulled to the bias voltage. We have used a capacitor to provide the reference voltage. The process of charging the capacitor and the switching the voltage to the gate is done in switched capacitor integrated circuit technologies. Switched capacitors effectively look like resistors because the current flow is limit likewise by the switching. Also, capacitors are easier to make with silicon IC processes than resistors. Hence, there is a potential benefit and switching bias using switch capacitors is claimed.

To keep sensitivity high, it is important to have good switch isolation and this is indicated by the resistor attached from the switch. Other components such as capacitors can work too, and thus it is more generally claimed to include an impedance circuit to keep the switch isolation. The switch circuitry also needs to be small and located as close to the gate as possible to avoid picking up other fields than that on the sensing electrode. Also it is contemplated that other components can be attached to the base to help set the bias point, and the resistance and capacitance or induction of the gate so that when the switch is turned on to bias that the transient behavior is set about a desired bias point.

Other JFET transistors or MOSFETs can be used by those familiar with the art and are generally called FETs.

MCS System Signal Conditioning

This later approach may have benefits when calibrating the sensors. In calibration, we put a constant E-field incident on the array. Each FET sensor can then have a gain and phase characteristic measured. Using a digital signal processing, the sensors can be all calibrated to look the same.

Figure 2:
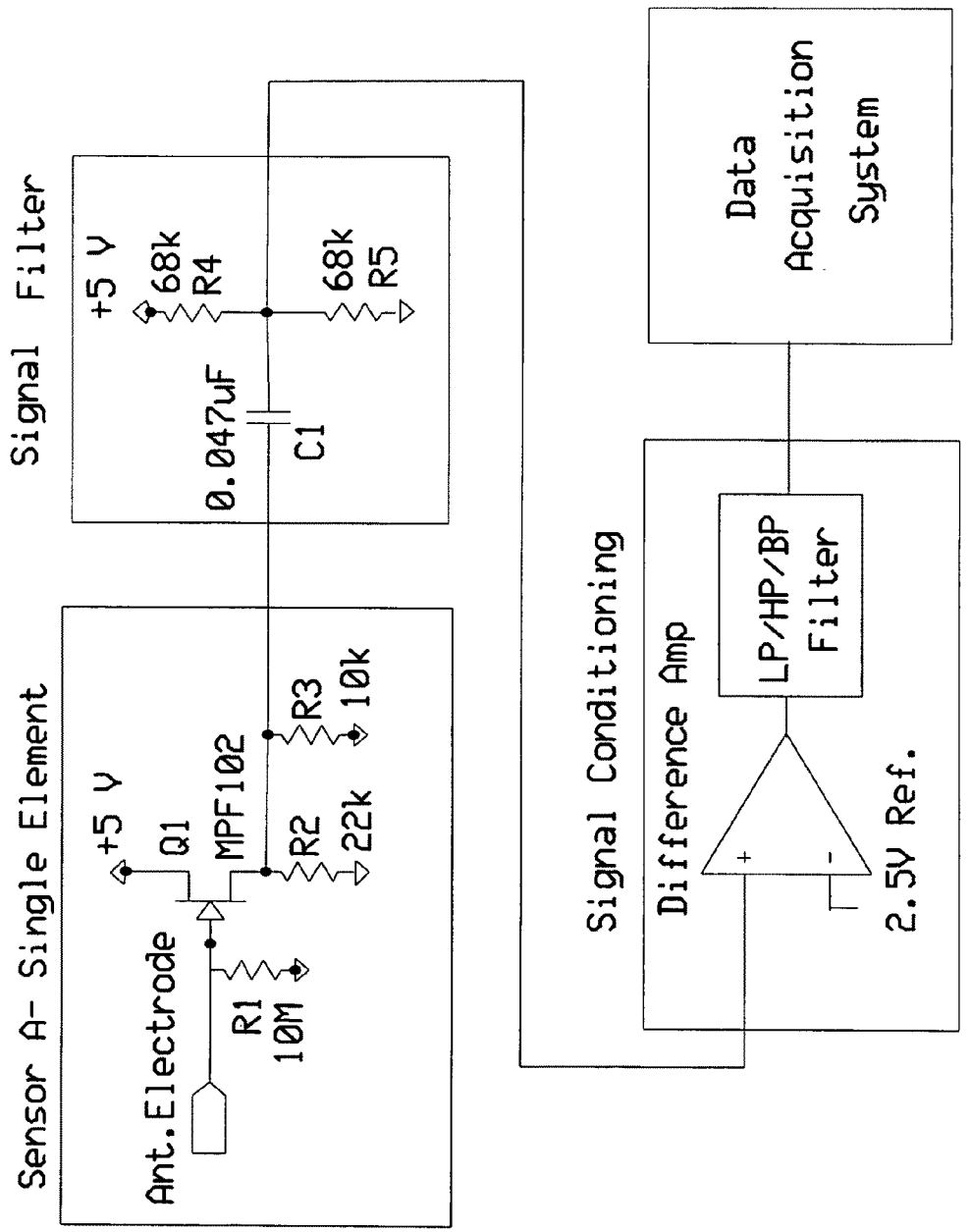
FIG. 2a) Shows the method connecting the preferred FET sensors for E-field sensor to the signal conditioning circuitry and digital acquisition system without the multiplexer (MUX).
FIG. 2b) and FIG. 2c) together show the architecture of the preferred embodiment of the invention to the MCS system and to audio communication systems.
Figure 2:
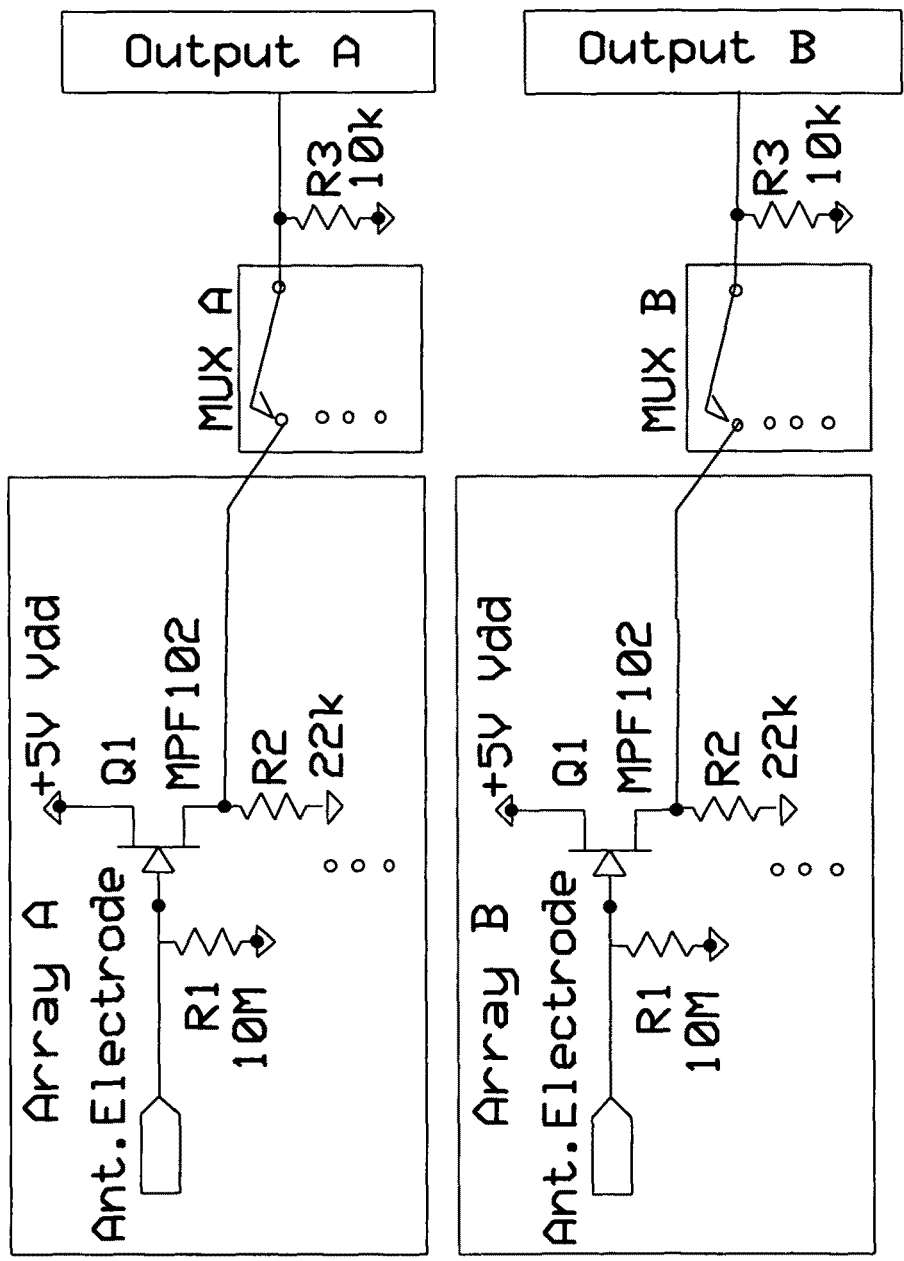
Figure 2:
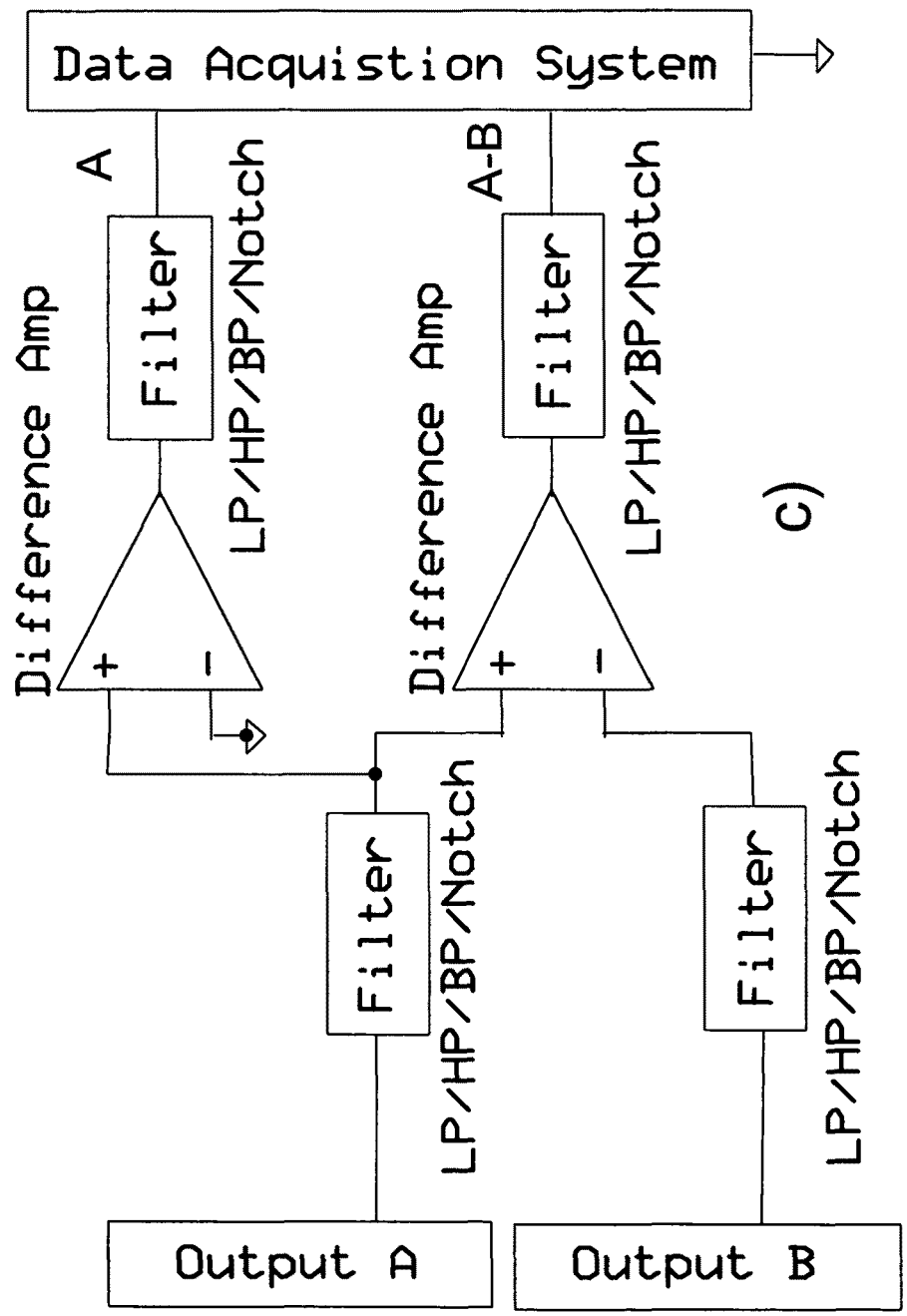

FIG. 2 shows the FET sensors with signal condition without a multiplexer (MUX). FIG. 2a is a single sensor system, and FIG. 2b shows a differential measurement between two sensors A and B. Both circuits in FIG. 2 show a difference amplifier that has two different purposes.

One purpose is to make a difference measurement the other is to allow the excessive common mode to be removed when touching the common electrode when powered by a portable battery system not in contact with earth ground. As the body touches the negative side circuit FIG. 2a, the common, the body pickup AC signal from the background. Hence, the line frequency signal and others that the body picks up as a big antenna increase in the output. Now with the difference amplifier as a part of the body moves closer to the sensing electrode, the signal decreases. This is a passive mode of operation for portable devices and provides a similar response that occurs when a person is grounded to earth in a system without a differential amplifier.

The difference amplifier was illustrated by Cehelnik in U.S. Pat. No. 7,242,298, and here it is shown with a transistor as the E-field sensor instead of an opamp. It is still useful, in particular more so here because of the high gain of the E-field sensor element that does not have a bias resistor or impedance. If it is not used, in the case without the bias resistor, the output of the common mode is seen, and the sensor won't show the decrease in AC field.

Thus it is claimed that for portable operations that the difference operation is important. This can be done with a high performance instrumentation amplifier like the INA105 series, or with a simple 2-stage instrumentation amplifier as in the PSOC chips. A two stage amplifier works well because it reduces cost. The application depends.

We will be shown for an active array and quite possibly a passive array, there is value in having two measurements from two co-linear E-field elements. Two sensors are needed to get a measure of the gradient of the potential on them, or the electric field vector, and the other is a representation of the average potential on the array of two elements. Having both of these measurements give a way to linearize the output of the systems with respect to range of an active source or static source. The system in FIG. 2b is setup to make the approximation that a single sensor element A is representative of the potential on the array element. The difference between sensor element A and sensor element B is obtained from the difference amplifier.

Note, the difference channel is better at reducing noise. It is the difference channel that one wants to use to detect communications. Notice the amplifiers are quite high gain, almost max gain for the part. It is important to gain the signal up as much as possible before signal processing. We just need to be sure that we don't saturate the ADC in the digital data acquisition system. Some differences in gain and bandwidth are possible with this design because the difference channel has less of a noise floor.

It is possible for some applications to replace the ADC with a power meter chip for both channels. This was attempted for some cases study to reduce the processing requirements on portable devices. However, it was preferred in our analysis to use a PC with a sound card, or a digital oscilloscope to add greater flexibility for experimenting and testing. If we want to suppress the line frequency, and digital notch filter or comb filter is applied with a digital filter such as a IIR or FIR as needed. Whether digital or analog signal conditioning or processing is used, it is important to have interference from fluorescent lamps taken out, and also the line frequency should also be taken out.

In more detail we discuss FIG. 2 again. FIG. 2a shows the method connecting the preferred FET sensors for E-field sensor to the signal conditioning circuitry and digital acquisition system illustrated without the multiplexer (MUX) to show how to construct a single FET element E-fields sensor. The 10 kOhm resistor is the load of the MUX circuit, and can be combined with the 22 kOhm source resistor to make an equivalent source resistor. One skilled in the art can adjust the effective source resistor to achieve other gain properties, but the one shown here works well with our signal conditioning circuitry. The gate bias resistor of 10 MOhm was chosen by experiment to make the DC output of the array sensor not susceptible to foot steps by resulting in a higher low frequency cutoff frequency. Larger values cause the FET sensor to have lower frequency response. We used one resistor as opposed to the two in a voltage divider to reduce component counts and wiring difficulties.

FIG. 2b shows the architecture of the preferred embodiment of the invention to the MCS system and to audio communication systems. The schematic is shown here for clarity with the assumption of positive and negative voltage supplies being used for the signal conditioning circuitry. It shows that the analog MUX uses the 10 kOhm resistor as a load. The A–B difference channel, and the A channel in voltages are computed from the analog circuitry. One recognizes it is possible to just capture the A and B voltages into a digital system and compute the difference digitally. The circuit could be modified from what is shown here by repeating the A channel top circuit for the B sensor channel.

FIG. 3a shows the preferred signal condition implementation for the MCS embodiment of this E-field FET array system invention. The sensor A and sensor B input signal provided from the output across the equivalent source resistor of the 22 kOhm in parallel with the 10 kOhm shown in FIG. 1a. The difference instrumentation amplifiers INA105 are unity voltage gain devices that are used in this case to keep the DC output nearly constant when the MUX switches to different elements. Other methods of electronic coupling are recognized, such as using an AC coupled approach. Another approach is to use the MAXIM MAX4410 headphone driver that gives no DC offset to the output instead.

MCS Array Configuration

Figure 4:
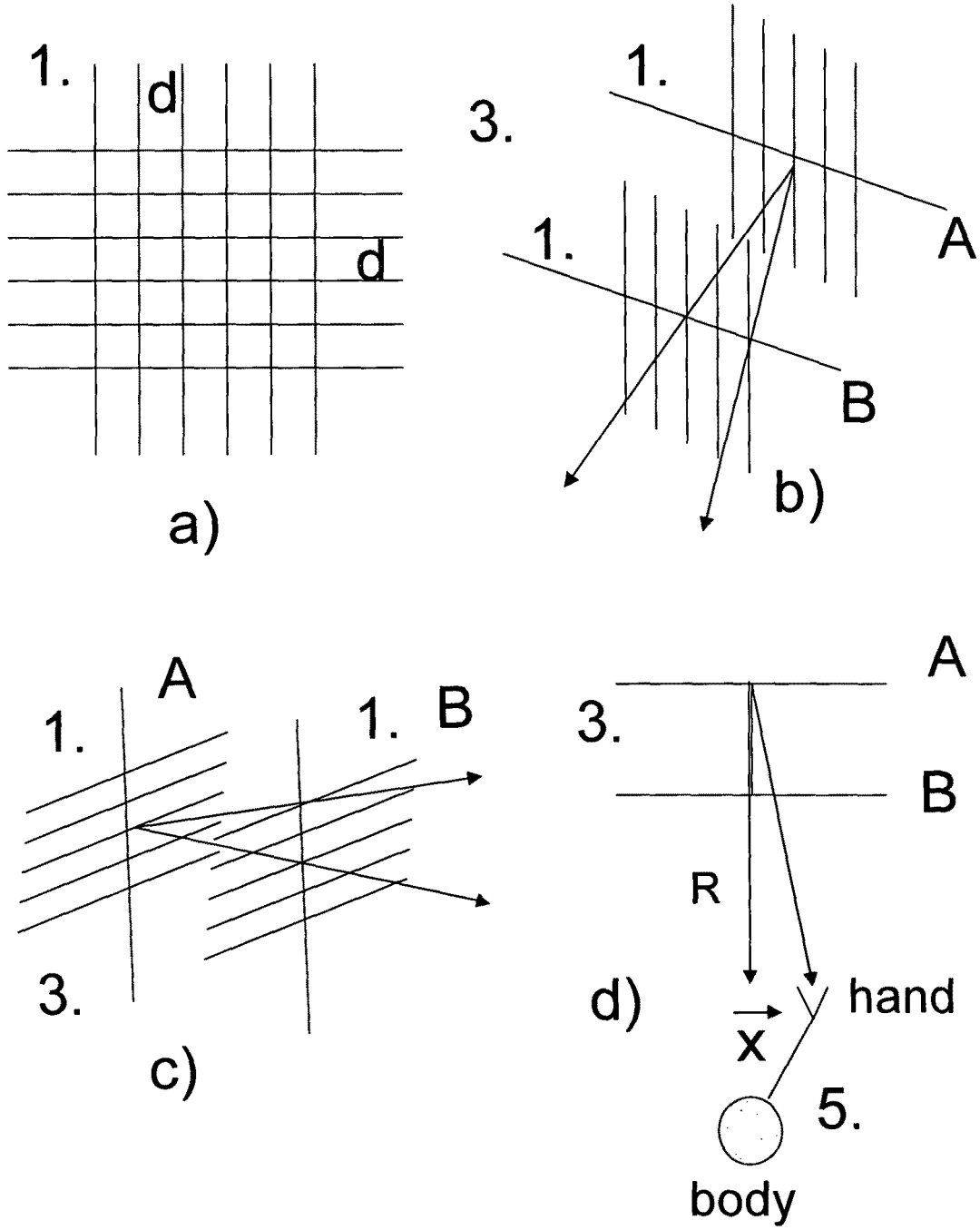
FIG. 4 Shows the preferred E-field array sensor element configurations for 2D and 3D operation.

FIG. 4 shows the preferred E-field array sensor element configurations for 2D and 3D operation. Item [1] is a cross hatch of sensor electrodes or strip arrays. The cross hatch is contemplated to be made of horizontal array on one side of the circuit board and a vertical array on the other. FIG. 4b shows how to used two vertical arrays to get horizontal angle or azimuth information to the active source. Item [3] is a dual parallel array. FIG. 4c shows how to use a dual horizontal parallel strip array to get vertical angle or elevation information to the active source. The angles are measured relative to the plane the common plane the element lye in.

We built a two pane array with parallel elements and not a cross hatched array. The hatched array is contemplated to be made with horizontal and vertical elements on opposite sides. Then the array would be stacked so that effectively we have horizontal and vertical sensing configuration in a two pane stacked array. The nice thing about E-fields is they go through objects, so it is not expected to be a problem making the hatched array as stated. Thus what is shown here give others the ability to build these arrays. We tested the horizontal and vertical performance by rotating the two pane parallel element array 90 degrees on the ground plane.

In our prototype of a parallel striped array, we make the sensor electrodes from traces on a printed wire board of about 0.015 inches wide and 2.25 in long. The circuit board material is G10 at 0.062 standard thickness. The boards are made with parallel traces on the front and back. The board was 2.5 high by 3.8 wide. The electrode ran parallel to one another and parallel to the height of the circuit board. The board was 2.5 high by 3.8 wide. They were separated by 0.2 inch. They were plated on both sides and with a plated via at the edge. This array was fitted up to another circuit board containing the FET circuitry that matched to the thru hole via. The boards were joined at the via with the soldering of a 24 gauge solid hookup wire. The FET board increased the length of the sensor electrode by approximately 1 inch. Thus the overall length of the sensor elements was 3.25 inches long. Every other antenna elements was populated, so the antenna spacing of d=0.4 inches.

Next having two arrays panes, we formed the array as in FIG. 4b. The separation is done with nylon standoffs and is set to 1.5 inches. This was found to be convenient and for connecting. Testing with several spacings from 1.2 inches to 2.5 inches seemed to give good directivity in the difference channel. The directivity of the received signal falls off to about half is detected voltage when the hand moves to 45 degrees off out of the plane formed joining them. Thus by having the multiple arrays, we can form a receive beam centered on different planes.

To use the array we fix one of the elements locations in the back. Say it is the center element in array A, see FIG. 4b. Then we scan horizontal or azimuth angles in time by switching the front elements in array B. The same process is used to scan the vertical or elevation angles. Alternatively, we can move both the front and back to any configuration possible to point at different directions.

FIG. 4d shows a setup to understand how the control surface moves and is sensed by the array. Simple geometry is used to relate how much angle is sweep by horizontal and vertical displacements of the hand or object located at a distance R on axis. With the array configuration given here, configuration a tan(0.4/1.5) gives 15 degrees or 0.26 Rad. The amount of distance to move this angle at 1 foot away, the displacement is 3 inch. This number then scales with how many feet the hand is away form the array center. Thus we see, the beams overlap, this is desired so there are no dead spots. To design the array for their application, one wants to have the elements be able to sweep over the angles the person will move their hand over.

Figure 5:
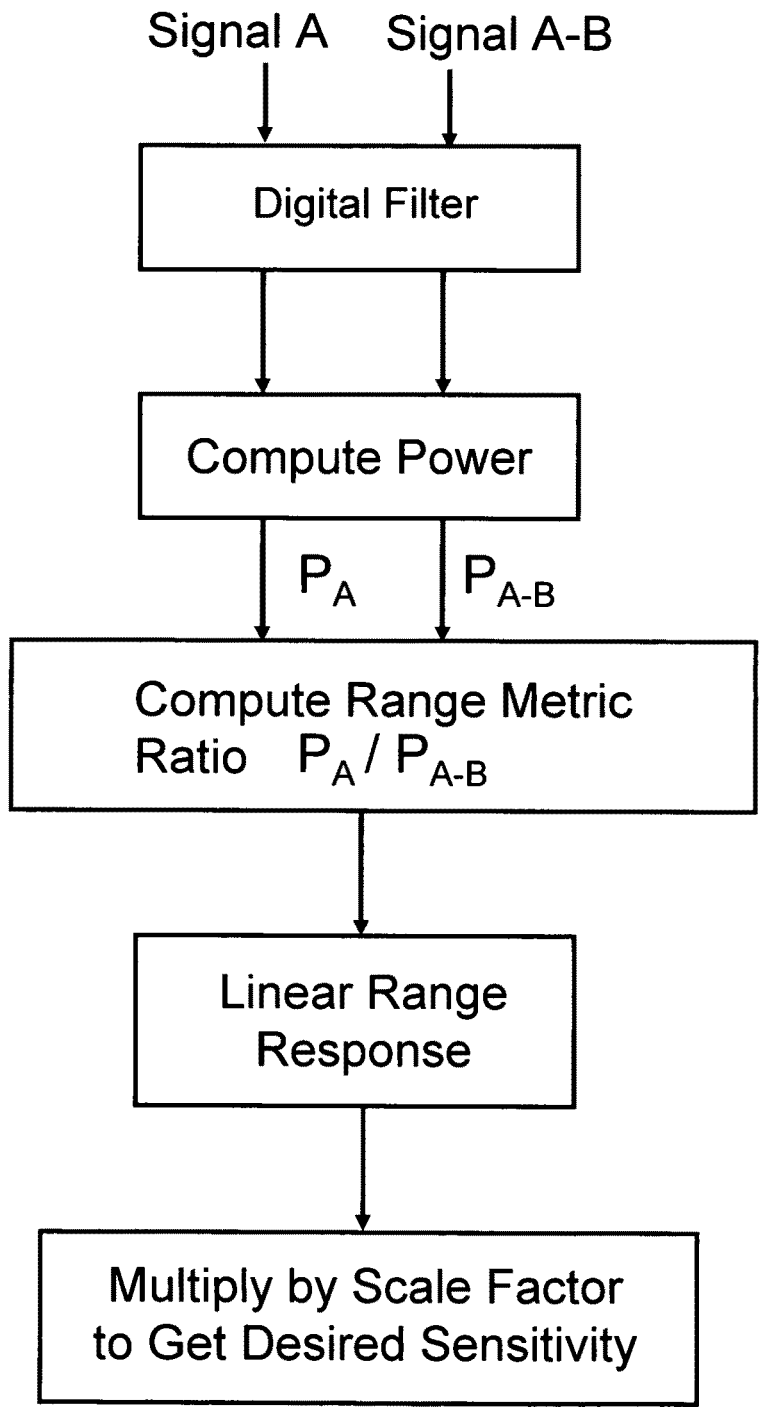
FIG. 5—Shows how to signal process the A and A−B channels to get a range metric that is linear.

FIG. 5 shows how to signal process the A and A−B channels to get a range metric that is linear. The computed metric is key to obtaining the range change dependence as the control surface approaches or moves away from the sensor. This is what makes the E-field sensor array work as a 3D sensing system.

The algorithm is presented is not obvious since E-fields drop off so fast with distance. Here is the algorithm rationale based on the assumption that the power measured on a sensor electrode from the source voltage depends inversely to some exponent n with the distance the sensor is from the source called R. This is the power detected function goes as one over the quantity R raised to the n power. Then the derivative with respect to range R from the source then decrease faster as one over the quantity R raised to the n+1 power according to calculus. Thus the ratio of the derivative of the power, or radial gradient, is received at the array to the power is proportional to the range R.

The power in the channel A and A−B are computed for the captured times series by demeaning, squaring and averaging. The ratio of power in A to power in A−B is calculated. The answer is scaled for display and storage. As the object moves closer, the metric decreases with respect to range relative to the steady state or equilibrium value. The opposite happens when the object moves away.

A good linear response was observed over arms length. It is conceivable that further modification or improvements of the linearization algorithm are possible; but what is claimed is one where the ratio of signal is computed from the simultaneous measurement of signal and gradient representation of the voltages measured on the E-field sensor array as described in this application. Computing just A or the average of A+B, or A+B can also be used. Multiple elements or stacks of panes used to increase gain are also processed similarly.

Figure 6:
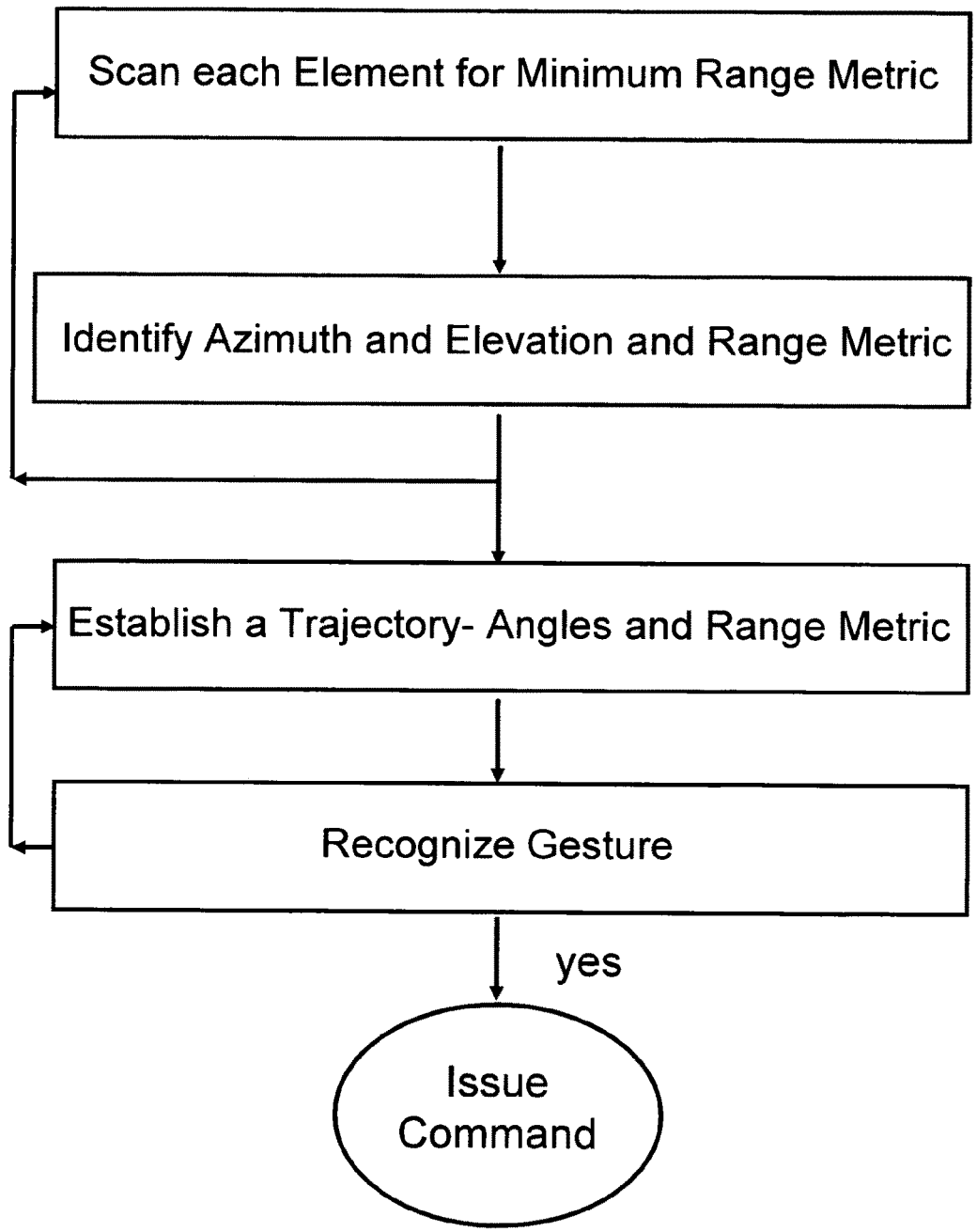
FIG. 6—Shows how to scan the elements in time and determine if motion or gesture is recognized.

FIG. 6 shows how to scan the elements or angle in time and determine if motion or gesture is recognized. We begin by rastering perhaps sequentially through angles. A measurement is made at each angle to collect the voltage time data from sensor A and A−B channels. Both azimuth and elevation angles should be rastered through simultaneously. High frame rate should be maintained for good tracking algorithms. First we have to search for the maximum response axis over all the array elements. This is seen by finding the maximum signal power in the difference channel. The signal has to be seen above the noise floor or some threshold to get to the second loop. It should be we know where the body is from the first measurement then estimates are made to determine which is the most likely elements to find the body in the next time step. Hence sequencing of angles can be done by predicting the next location of the hand or control surface by using a Kalman filter.

Then the range metric is calculated. Either range metric or difference channel can be used to find the angles corresponding to the angle of the source from the array. The advantage of the range metric is it does not depend much on the source amplitude with range because it is a ration. The range metric though is large when the signal to noise ratio is low, thus when there is no source the maximum value on the range metric has to be capped or watched.

In this case trajectories are compared with desired gesture trajectories. For example a circle is a circle, the attributes such as size and range. A calibration procedure is used to initially calibrating the system by collecting metrics at different ranges on axis. The users move their hands two and from the sensor at different ranges on axis of the array. Also the sensor responses have to be balanced this can be done in the factory. Using the metric on how strong a signal is at various ranges, the computer can determine a range estimate. Then the angles in elevation and azimuth are used. The geometry of the motion is put together from the trajectories and the gesture trajectory shape is scaled to a range used for comparison. The gestures can be defined by training examples at a range or defined as a shape in software.

Also it is conceived that at times it might be useful to code the user signal with frequencies or digital data, and possibly adjust the signal strength applied to the user's body from the E-field active source. This is possible by a wireless connection to the host computer to the E-field source that the person is wearing.

Figure 7:
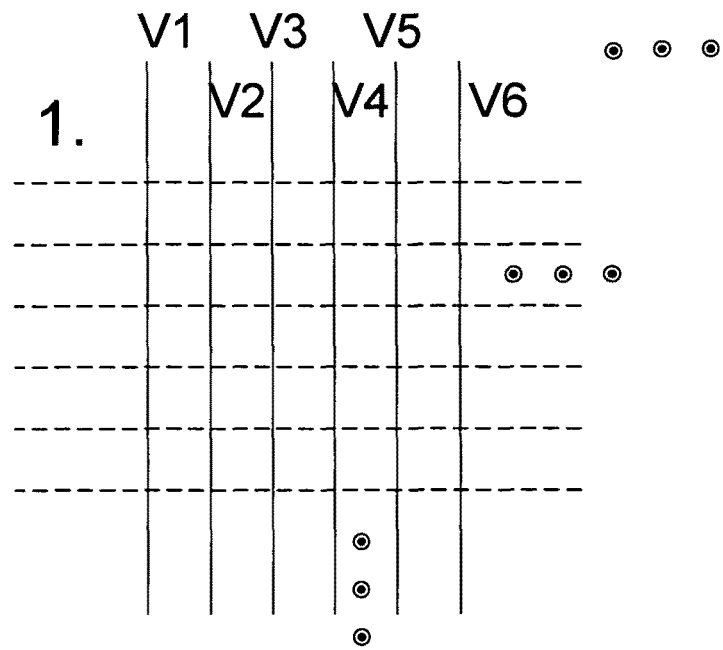
FIG. 7—Shows method of increasing signal to noise gain by combining interlaced sensor elements. The A−B channel is made from a summation of difference between elements and the A channel is made from a sum of elements.
Figure 7:
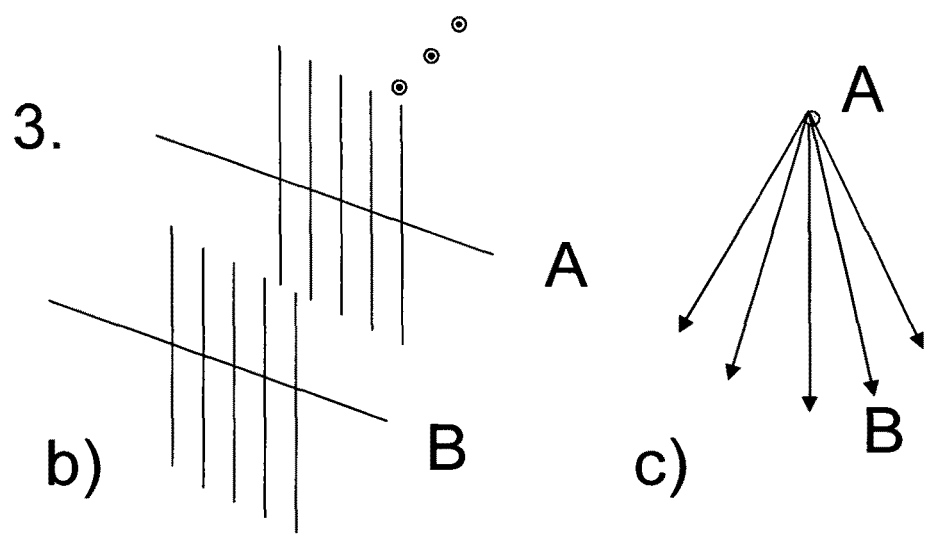

FIG. 7 shows a contemplated method of increasing signal to noise ratio of the measurement or array gain by combining interlaced sensor elements. The A–B channel is made from a summation of difference between elements and the A channel is made from a sum of elements. Scale factors are possible to keep the signals within the range of the electronics. In analog electronics this can be done by a summing amplifier. For example we have contemplated to sum the even elements and the odd elements. Then consider these as an effective A & B sensor. Now send this in to the signal conditioning circuitry to get A and A–B. FIG. 7a indicates the processing can be done of the single strip array level. The preferred or most sensitive direction is perpendicular to the elements and in the plane of the array. The signal to noise ratio increase with the number of elements added. FIG. 7b indicates additive process can be done on stacks of parallel array to be more than two. FIG. 7c shows the directional response when a back element is A is not switched and the front elements of B array are switched. The maximum sensitivity direction lies in the plane joining the two elements and in a direction perpendicular or normal to sensor electrodes. The front element and back element can be switched to change the sign. In reality the array is sensitive to both front and back directions. Shielding is possible to eliminate the response in an unwanted direction, however care must be used to balance out the signals on the element pairs, but is possible changing the gain. Ideally we want a constant background filed parallel and perpendicular to the sensor antennas or elements. We use a single place a ground plane under the array so the ground plane is perpendicular to the vertical elements and horizontal elements.

Figure 8:
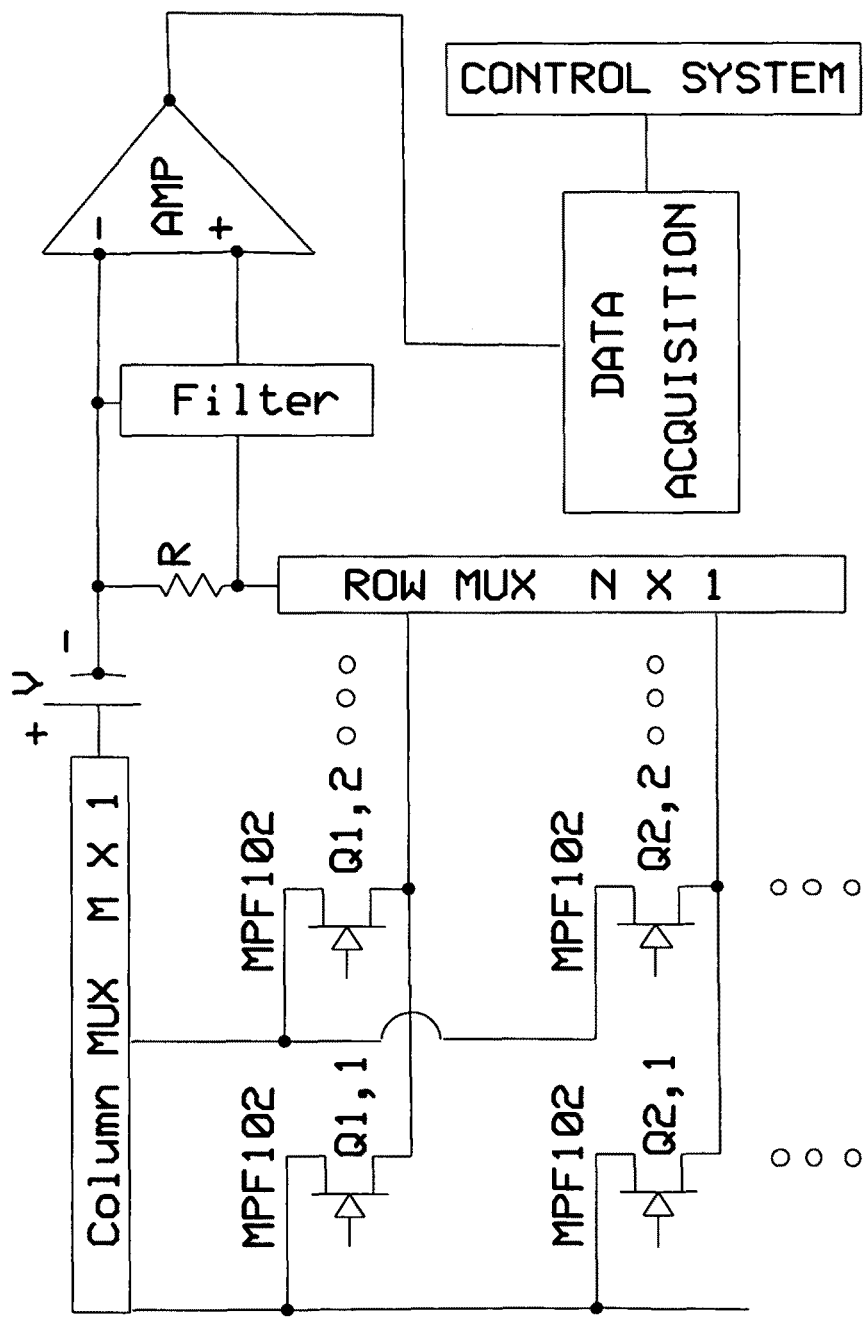
FIG. 8—shows a multiplexing scheme for a 2D pixel array.

FIG. 8—shows a multiplexing scheme for a 2D pixel array. The connecting of the drain signals caused some problems with isolation because signal traveled from the source to the gate. In the MPF102 JFET the source and drain are interchangeable. Those skilled in the art can see this concept of making an E-field pixel array using MUX perhaps by using a MOSFET. The line array was used with success and is represented by having only a single column, M=1. The pixel array could be used for FIG. 9—Shows the dual channel MUX circuit used. The circuit was setup on a circuit board with the option to route 8 sensor signals into both MUX with a header so that allows switching between elements in a signal array pane or between panes such as A and B. The outputs are taken out across the 10 kOhm resistors.

Figure 10:
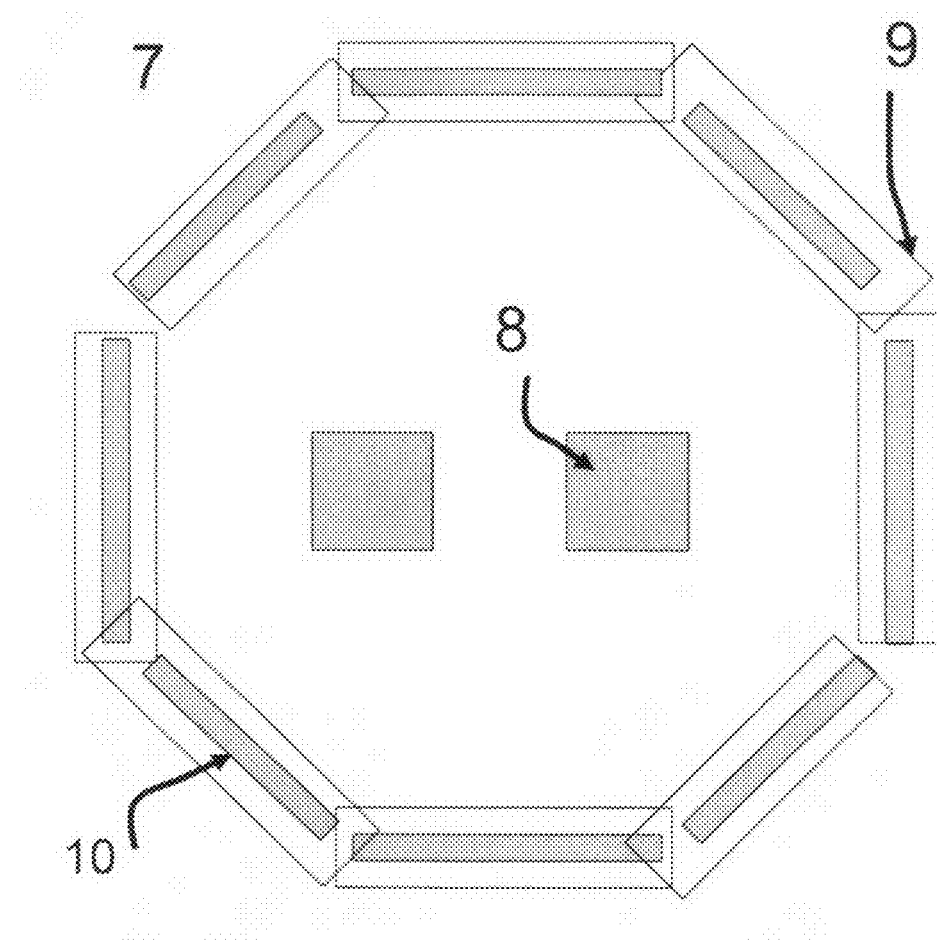
FIG. 10—Shows top view of WhiteShark Sensor Pod Layout [7]—octagon sensor and ground reference square slug on top [8], and reference electrodes [9] below sensors [10].

FIG. 10—Shows top view of WhiteShark Sensor Pod Layout—octagon sensor and ground reference square slug on top, and reference electrodes below sensors.

Figure 11:
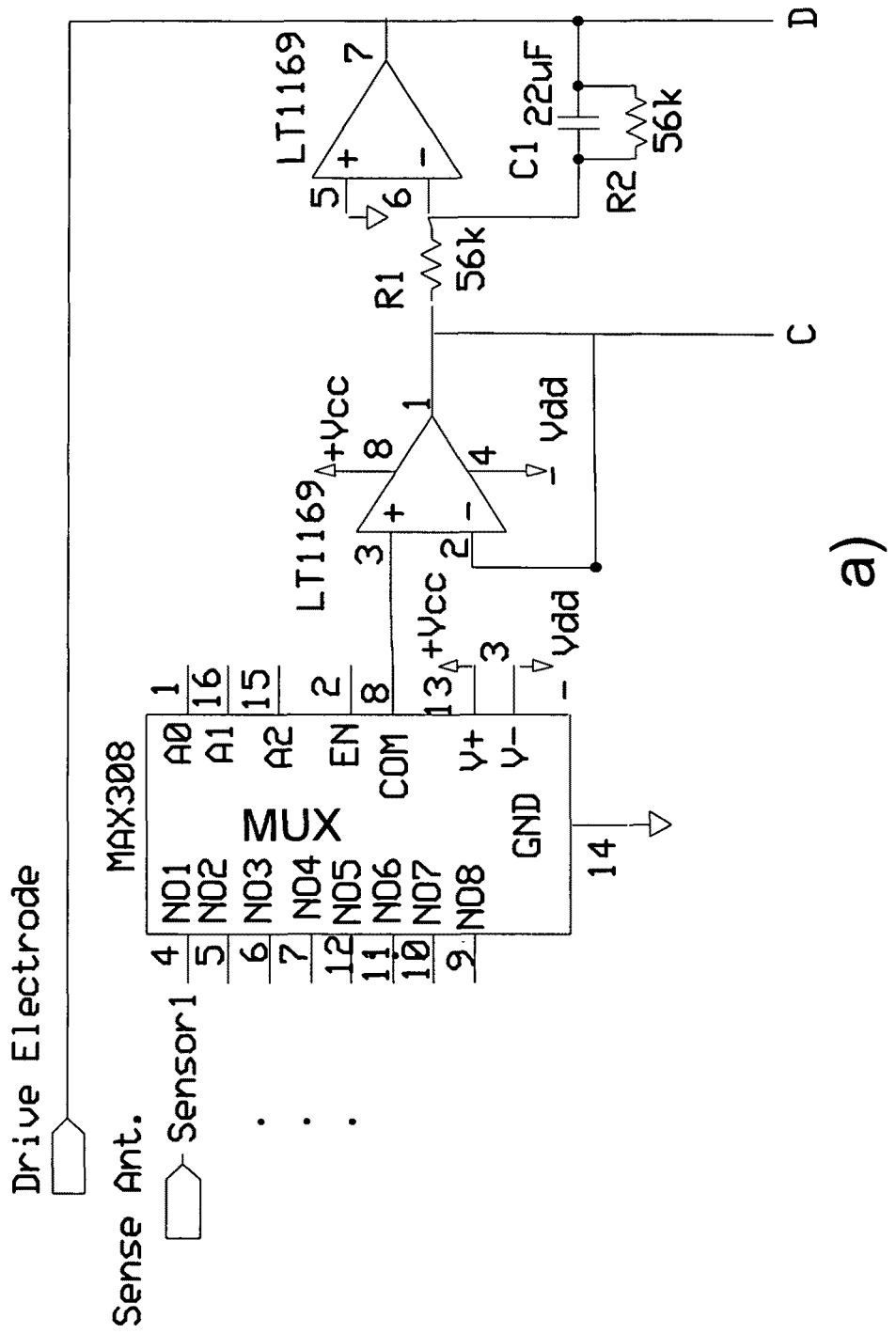
FIG. 11a) and FIG. 11b) and FIG. 11c)—Together show a sensor array using an E-field sensor with a MUX in front can be useful for making touch systems for use with the active source. It also shows a configuration that is conceivable in the future for MSC arrays if the E-field sensor is within the MUX or behind the MUX.
Figure 11:
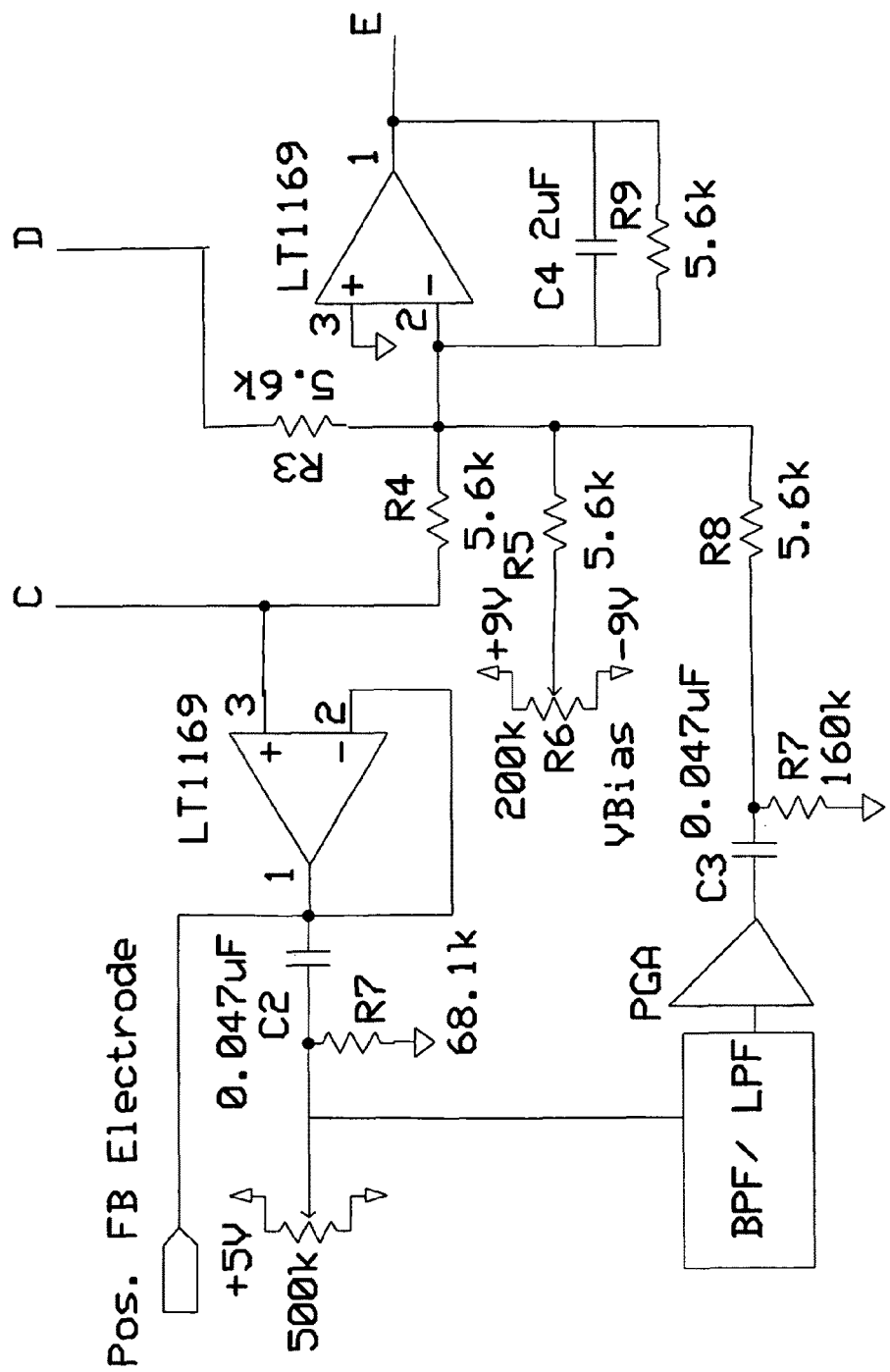
Figure 11:
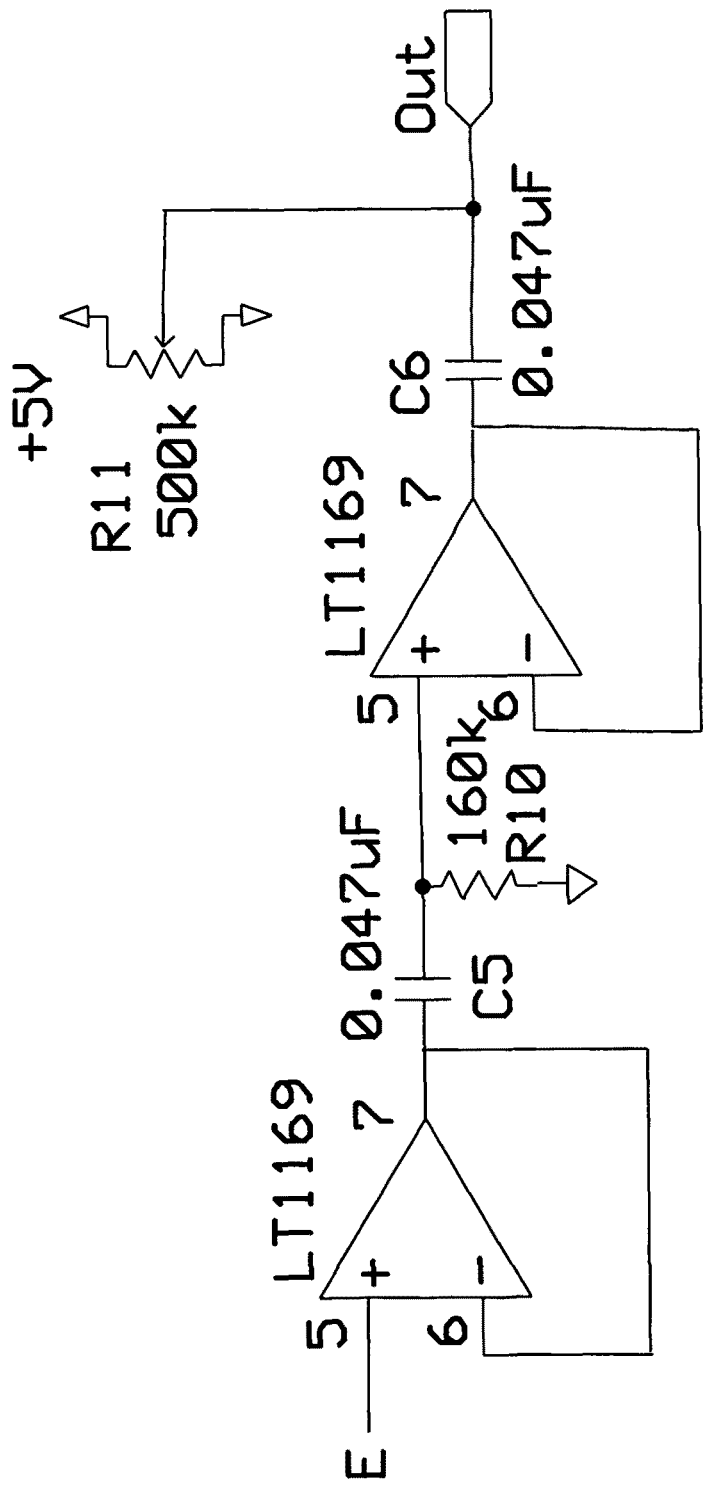

FIG. 11—Shows using an E-field sensor with a MUX in front can be useful for making a touch systems for use with the active source. This type of connection having the MUX in front was tested with a FET sensor in FIG. 2a with the MUX in FIG. 9. The FET sensor electrode was a 0.1 in spaced header male. It was intended to look like a pixel array. It was brought out through a ground plane cutout and fit with perfboard. The elements extended a 0.1 in above the groundplane. Sensitivity was low but indeed signals could be seen when the element was touched or we were an inches away. The sensitivity was much less than that of having a FET sensor in direct contact with the sensing electrode. Touch screen systems may be desired if a MCS is included in a screen. The MUX switch has to have high isolation to avoid using FET sensors at the connection of the elements. The input impedance of the FET in FIG. 2a is that of the bias resistor. It is contemplated that in the future the analog MUX may have sufficient isolation or input impedance to essentially present or become and E-field sensor. In that case there would be no need to have FET sensor on each element, but a single FET sensor that is basically the MUX. This configuration is to be covered in this invention, where essentially the MUX is the E-field sensor having switches and a FET sensor. An alternative configuration is a low loss high output impedance MUX that is followed by an E-field sensor after it as described here and shown in FIG. 11. Alternatively we can increase sensitivity can be increased with using FIG. 11 or a switched gate bias circuit as described in FIG. 1b and FIG. 1c.

Another way to further increase sensitivity by having a MUX in front of the E-field sensor is to increase the sensor element area. This is proposed here to be cross hatched of uniformly spaced strip array as in FIG. 4. A single pane is used with horizontal and vertical opposing arrays on each side. The MUX is switched across all elements, first say holding the horizontal element fixed, and switching through the vertical ones. Then repeating the process, to switch to the second horizontal element and the active signal is conducted to the elements where the finger is located. The process is repeated at an update frame rate, and a processing method is used to identify which elements were closest to the active object or even touched. Either time or frequency processing is possible to see the power received on the elements. We have made E-field sensors with electrodes ⅜ in wide copper tape that were 12 inches long. We were able to detect audio signals in differential mode from 10-12 feet away using a FFT signal processing filter for 4096 points. The parallel elements were 12 inches apart for the difference processing.

In active MCS is also realized here what has been taught that we can transmit a signal on each element at a differing frequency or waveform or digital code so that and external E-field sensor recognizes what elements are actually transmitting. This makes it convenient for an object or system to know what data it is collecting or where the sensor is relative to the signal level received. The user is using Communication Using E-Field Array System In 61/070,099 and in 61/070,106 Cehelnik presented a broadband E-field sensor. It is repeated here in FIG. 3b and shows how a broadband E-field sensor is made with the traditional gate voltage divider bias resistor network for JFETs. In this case the design is intended for high frequencies of about 15 kHz up to 30 MHz that also functions as an amplifier for floating gate E-field sensor array in FIG. 1. The high pass filter is used with C=470 pF and R4=22 kOhm. The bandwidth of the MAX477 is 300 MHz at unity gain.

In 61/070,099 removed the bias resistors R1 and R2 in FIG. 3b, and ran this amplifier in a floating gate mode with a reference electrode. The E-field reference bias is provided by the video monitor that has a ground plane, or an added ground plane when imaging according to 61/070,099. Using this modified sensor we were able to capture video pixel signals from a CRT and see LCD display lines switching. We were also able to see evidence of finding signals from illuminated LCD pixels by using two such sensors. We also followed the extension of using a differential array to sense location of pixel, on element is at the side. The fact that the front panel of the LCD and CRT display is a ground plane make is more difficult to localize a pixel. It is understood with the technology described here and in U.S. Pat. No. 6,107,009, that the process of making a system to turn on pixels of E-fields for imaging or motional command system is possible. The manufacturing technology, assembly and operational details of a display is needed to move the application into the display monitor.

Another set of communication observations at high frequencies at 10s of kHz to 10s of MHz. We first confirmed the sensor in FIG. 3b had good video bandwidth of the amplifier by driving the antenna electrode with a wired input video signal. It tracked the video voltage and phase well when compared with a 100 MHz bandwidth oscilloscope. Next this amplifier was connected to the output of the MUX in FIG. 1b. A single pole high pass RC filter was used to make the coupling. We then observed E-fields digital data from a RS232 single wire driven with 5 Volts digital data from a PSOC system on a chip CY24C784 running at 10-100 kbps at distances of 6 to about 15 inches. These signals were also easily coupled through the body. The signals were somewhat reduced in pulse width and had over and undershoot because of bandwidth constraint we expected this. This was also confirmed because it was also observed that when touching the sensor antennas of the arrays in FIG. 1b, the closer we got our finger to the receive element the wider the width of the digital pulse and the more representative was the signal. Hence, we see the bandwidth increases as we couple the active source signals closer to the element as expected. This makes a simple method of checking to see if an E-field sensor electrode is touched. The combination of these tests confirm it is possible to tune the system to capture high frequency digital signals for communication. Signal processing can also be used to equalize the frequency response and get better representations of the active E-fields transmitted from wires through air and across the body.

Another observation at audio frequencies now made. We played music from the output of the sound card on an insulated 18 inch 22 gauge wire. An 8 ft shield audio cable was used to connect the soundcard to the wire. The sensor system was that in FIG. 2b and FIG. 3a. The sensor electrodes were made vertical using 6 inch number 24 gauge wire solid insulated hookup wire.

The music was detected best on the difference channel of the system made with E-field FET sensors in FIG. 2b and the preferred embodiment of the E-field array signal condition circuit in 3a) since it had less 60 Hz and harmonics. We played the output on an analog audio amplifier attached to the A–B output instead of the sound card. The audio was sent to the E-field array system over a distance of several feet from a single channel signal output of the sound card.

If instead, a digital oscilloscope is used at the output of the difference sensor, an a test tone is used with frequency range of 2 kHz to 4 kHz, and a 2V peak-peak output voltage, the tone was observable at 15 feet. Thus it seems reasonable the with this disclosure, we can create various devices that can communication between E-fields.

Results are we has shown here with this technology that individual sensor elements and differences between pairs of sensor elements are able to receive audio signals directly through air or via body conduction from a wire driven with audio signals from a sound card of a computer or an headphone jack of a MP3 player. Note for some headphone audio players, as current amplifier or transformer is needed on the MP3 headphone output to allow the high output impedance of the headphone amplifier to drive the audio in wire for detection. A simple FET amplifier can is a remedy.

Wearable Integrated Circuit 8 Element Octogon POD.

A Motional Command System (MCS) system array was built for experimental purposes. The user holds or wears a sensor pod, FIG. 10, that is printed circuit board material containing E-field antennas and amplifier sensor. The sensor pads are in this portable variant, are place in an octagon pattern, FIG. 10. The sensor traces [10] are about 1 in long and about 3/16 in thickness with rounded edges. These are distributed on a 3 3/16 edges square printed circuit board. The pair of horizontal and vertical sensor pads are located about ¼ inch from the edge of the PCB.

Two Analog Devices ADTL084ARZ surface mount parts are placed on the bottom side of the sensor pad. This a quad opamp package of higher performance and that TL084. The sensor pads are connected to the eight amplifier inputs with vias running to the bottom side. The standard TL084 parts by TI and National were used but the power supply line trace on the layout is between the + input of the an amplifier pair. The supply trace runs parallel to the input and the input pick up the static field from the supply and saturated at 5 Volts. We fixed this by using a jumper by bending the power supply pin upward on the chip, moving is away from the input antenna connects. We then made the connection with thin wirewrap type wire. We found using the ADTL08084ARZ that this was not necessary, and the bias ran at about 1.0 to 1.5 volts.

The bias was controlled by a reference electrode FIG. 10, on the topside of the PCB above the amp chips a circuit trace square or slug was laid that was connected to common FIG. 10. Also a floating reference electrode patch was placed underneath the sensor pads FIG. 10. We can apply voltage if needed to modulate the E-field sensor or attempt to control bias. However the slugs mostly push this potential toward common.

Next another PCB or common electrode is placed on the opposing side below the sensor pad PCB, not shown. Standoffs are used to allow the board to not to touch the top board. In manufacturing this board can be a conducting plastic part on the case or package that one holds or wears. In our case the common electrode board is a two sided board, on side would be okay too, it creates an equal potential surface, and forms the interconnection between the body and the common voltage.

To make the connection to the body, we use a 5 MOhm, 10 MOhm or sufficient resistor connected from the sensor pad board common or equally the voltage source common to the body. Hence, common currents are limited for safety. Also options were explored to couple AC signals sources to the sensor pod reference electrodes so they form the background signal. In order to have the coupled background signal decrease with the approach of the common connected body, the capacitance must be extremely low link pF. We actually spit up our reference electrode trace into two pieces. By keeping capacitance low between an AC source electrode and the sensor, we can see a decrease in the source signal with approach of the hand, or finger when in contact the reference board.

Alternative to the above passive mode, we can use an active mode where we drive the persons body with a DC or and AC signal, and sense the approach. The body is made in contract with a signal source in the audio band of 2-3 kHz of about 2V pp from a soundcard. A resistor is used 10 MOhm between the body and the source to keep current low. Alternatively, a stylus other control object that contains an E-field source from a wire driven with an oscillator voltage signal can be used. The current has to be sufficient to allow the charging of the source antenna or object to the drive voltage. The signal level drops and frequency response goes reduces if the source can not source the current. This is because the body needs to charge up to maintain a potential, with high resistance the current is low, the charge up takes a long time. Thus for small source currents, we need much additional gain to see the signal. An active stylus works fine, or even a resonant type stylus to an external field.

Next, we wish to say that Cehelnik has made the E-field sensor useful with an unexpected benefit by operating the sensor pod at a reduce drive single+sided supply voltage to an E-field sensor, that the Bias DC voltage is controlled.

In fact, running the ADTL084 ARZ opamp with a one sided +5 volts supply or less, and using a ground electrode, the DC bias can be stabilized without using a bias resistor. The bias electrode is floating as a constant potential surface. In fact, this arrangement allows for good portable operation. Modeling of parts using a SPIC program showed the DC bias level versus supply voltage.

Figure 9:
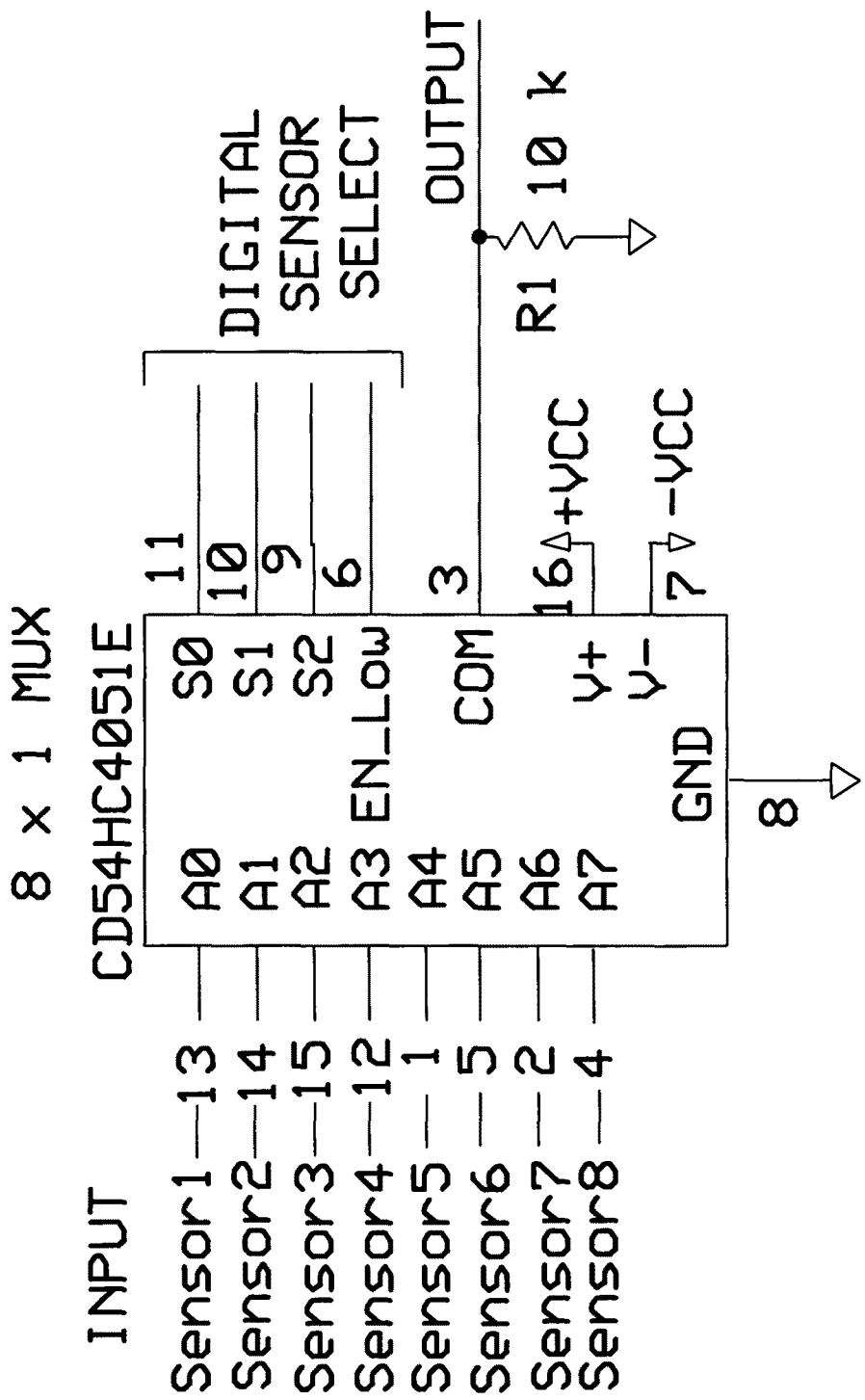
FIG. 9—Shows a single 8×1 MUX circuit used. The circuit was duplicated for dual array use. It was setup on a circuit board with the option to route 8 sensor signals into both MUX with a header so that allows switching between elements in a signal array pane or between panes such as A and B. The outputs are taken out across the 10 kOhm resistors.

The sensor signal flow through the MUX with circuit shown in FIG. 9. The output is above the 10 kOhm load resistor going to common. Next the signal is band pass filtered with a RC network. Also we can use the Mixed signal PSOC from Cypress to do the filtering.

Spikes in DC are removed by having the common in contact with the body. External spikes do to foot steps of other can be used to monitor an interact with the game, or be filters out with digital signal processing of the ADC signal.

We have an 8 channel Sensor pod and use the ADTL084 8 times in the pod. Then a MUX of 4051 is used to switch the sensors. By using two such analog multiplexers passing signals from 0-5 Volts, the difference between any two element is measurable. They can be detected using instrumentation amplifiers. We have detected low frequency signals 20 Hz or less from a test wire, and believe we can detect bioelectric signals such as EKG, EEG, muscle contractions.

Then we send these signals into an instrumentation amplifier or equivalent difference network. We use an adjustable gain amplifier in a microcontroller, a PSOC CY8C243784 USB series for MCS where one we measure the voltage relative to the body potential. The body is at common. We need two difference amplifiers to read the signals between two sensors. At this time we do this with other components. Depending upon the quality of noise level desired chips must be chosen accordingly. We can use other series Cypress PSOCs for multiple instrumentation amplifiers. Then send the signal to the USB interface of the CY8C24894.

The signal is bandpass filtered after coming out of the MUX. The output of the MUX has a load resistor.

The Sensor signals after amplification are digitized in the ADC, the MUX is controlled by the PSOC. The gain is controlled by the PSOC to allow for acceptable range limits of the signal.

The CY8C24894 device has a HID human interface device class that allows for our MCS signal form sensors, a digitized in an analog to digital converter. The mean value of the sensors signal level is measured, and if one of the sensors changes suddenly with a time constant indicative of hand motion, the data collection process begins, and returns to pause when the mean value has not changes for much about a second or more. This can be tweaked for optimum power control. The sensor data collection can run continuously, but consumes power. When we power the device by USB this is not a problem.

The data is sent to the HID human interface Device such a mouse through PSOC HID class interface. This mean the computer can read it as a mouse. We can send hand position and actions such as clicks. Also gestures are recognizable if gesture recognizer is used.

Summary of Results for Octagon Pod:

It was intended for use as a passive device for wearable processing. A circuit board screen captures is shown in FIG. 8 of 61/070,106, and repeated here as FIG. 10 of this application. It was made with two AD084 opamp integrated circuits based E-field sensors. The elements on the sides were about ¼ inch wide and 1 inch long in the flat plane of the circuit board. Opposing sides were parallel. The separation between elements is 2¾ inches. It was intended that the user would be in contact with the common, and the user's hand or finger could move near to a sensor and gestures could be recognized by observing decreases in the background 60 Hz. Active use was also considered and experimented with. The pod had a reference electrode on the bottom side of the circuit board beneath the sensor element.

The octagon pod did not contain shunt bias resistors because the added gain was desired. The support signal conditioning circuitry of FIG. 2a, with pod sensor replaced, was done on a PSOC CY24C794 microcontroller, and the MUX was used in FIG. 6 of 61/070,106, or here it is FIG. 9. A 2 stage differential amplifier in a CY24C784 was used. The pod was also compatible with the signal conditioning and MUX circuitry as a replacement for the JFET array shown here FIG. 2a, and with later electronic FIG. 3a circuit when using the MUX in FIG. 6 of 61/070,106.

The octagon pod DC offset did not float away to saturation. When putting on 6 inch vertical antenna wires, #22 solid insulated wire, we could detect footsteps up to 20-30 feet away with just the sensor pod connected to an oscilloscope at 20 mV/div. The pod only had unity gain E-field sensors as shown in FIG. 1c without the switch but a reference plane was used under the sensor element.

It was found that even for a passive MCS, the sensitivity to low frequency quasistatic fields caused the AC gain to change. It was not possible to post process out the DC. This array is disclosed herein but although has some features, the use of an operational amplifier as sensors still brings in trouble with routing and placement of sensor elements. However, the design worked well as a test bench for integrating the controller and multiplexer.

We were able to show that differential processing of elements from the pod allowed for direction determination of passing wands and punches, and direction finding to people stepping. This was done by using a difference amplifier between two elements by using two oscilloscope channels in difference mode.

We also observed that when using a completely battery powered system where the body and sensor array is electrically floating and the body is in contact with the common electrode of the battery, the system did not respond to the user's foot steps because of the differential amplifier used in the signal conditioning. We were able to detect other people interfering though. This is a good thing for gaming circuits and for detecting the approach of people. This feature was discussed believed to be discussed in Ser. No. 11/446,768, "Method for Alerting Physical Approach".

Thus with this pod in a flat mode it can be useful design for wearable people detector. It can be made into a hat by using flexible circuits is another option. Future application may increase sensitivity by removing the reference electrode to reduce capacitance. Little control was seen when applying a voltage to the reference electrode. Using the opamp AD084ARZ or AD082ARZ, or equivalent low voltage high performance TL082 from Analog Devices may not float away without a bias electrode.

Also a decrease in background signal did occur when the user was in contact with the common electrode and their hand approached a sensor element as in MCS, but now in floating mode. It would seem reasonable, and was later tried where shunt electrodes were added.

Wand or Smart Stick-Active Noncontact Octagon POD in a

A noncontact active mode was also tried and found successful. The source was made by wrapping a Quaker Oats Tube with 20 ft of #22 gauge wire and applying an audio tone of 2-3 kHz from the sound card between the two ends. Open circuit should work too. A resistor, approximately 10-100 ohms was also put in series with the coil so to limit the current. Now the octagon sensor pod was placed inside the tube with its circuit board perpendicular to the axis and in the center of the tube, the pod would just lodge inside because it was square. Then as a hand approached the tube we could see the direction by looking at the difference between two opposing sensing elements. The distortion of the field was seen. Other objects can be detected too. The system was sensitive to sensing direction of approach. The range was a about 3-4 inches. The input signal was 2 Vpp, the gain of the oscilloscope difference measurement was about 10, but differential gains from about 1-100 can be used depending upon the sensitivity of the detection system. A Cypress PSOC chip, like the CY24C784 can be used to provide the multiplexing, instrumentation amplification, and ADC detection. It also has a USB output to send an alarm signal, or a wireless USB.

Hence, one can thus see immediate applications of this cylindrical form factor sensing system in wands, or sticks and swords that can be made to passively detect the presence of objects. The physics works anyway, if we move toward this sensor system or the sensor system moves toward the object. The object conducts the field and causes a change in the field across the sensor elements. It extending vertical wires on the sensor pod element, and shrinking size of the element to just the diameter of the wire, and shrinking the separation between element, that a small cane sized wand is possible.

Thus there could be eight, or more or less, parallel sensing wires concentric about the axis of the stick. The number of opposing sensing pair gives the angle detection along the plane joining the two wires. The direction is determined by the sign or phase of the voltage. The sensor signal voltage nearest the approaching object is largest because the field is conducted stronger to the nearest sensor antenna. The measured difference between opposing sides needs balanced in the circuit so the output in small except when the object is detected.

One skilled in the art is able to see that such sensor array with and without the source configuration of various sizes can be used with E-field sensors having other or multiple frequency response characteristics. The Source can also be modified to be just a single conductor such as a wire or a conducting tape. Hence detect the DC of other approaching plastic or static objects or body steps, or the frequency response can be made to detect another source of E-field energy.

Wii Type Game Device Type Interface and MCS Controller:

The popularity of the Wii game and trademark of Intendo is largely due in part to the method of motionally interacting with the game through accelerometer based controller. We propose such a controller that Cehelnik has stated previously, that a person can wear the sensor. The sensor has an electrode pad that is in contact with the body skin. This is the back of a cell phone, or a PDA or a device strapped to the forearm or elsewhere.

Next we place an accelerometer X,Y,X, and tilt sensors, or a sensor comprised of one of these so to give an measurement of the trajectory of the device in time. The 2 axis accelerometer from radio Shack with 3 g/V sensitivity, is a good candidate that seems capable of giving the x, and y acceleration of moving it. O The other dimension can be given by the relative position of a persons body or another person who is electrically in contact with the first one. Thus approach sensors are possible form other people. Of course the accelerometer cost sensitivity and degrees of freedom that it measures is a trade engineers are able to make for their product.

Next we use the E-field sensor or Motion command system to measure the persons proximity to the controller. Thus by making the Wii controller or variant thereof, be comprised of an E-field sensor we can further provide a sensor to provide an excursion measurement from the location provide by the trajectory measurement.

Hence we can click, or stretch the position or size of objects, or rotate, by moving another body part, perhaps the hand to and fro in proximity to the controller.

The digitized sensor data is sent to the host computer through USB, it can also be wireless USB for processing. We can send frames of digitized data at 480 Hz 12 bit data interlaced between 4 sensors. The sensor are in pairs orthogonal to one another as describe in the MCS motional command system patent. The signal are collected for a minimum of 1 line frequency cycle, two is better.

Then a FFT can be used to get the amplitude and pass it to the game through the software interface. In general there is a trade between the sample rate number of sensor elements. A table of sensor amplitudes versus time is used to compare with predetermined gesture signals.

A relative location algorithm is used to estimate the positions of the hand to the center of the sensor pod. This is based upon the position of the pod, and the sensor signals. In calibration mode, the channels are balance in gain and phase with the hand directly above the sensor of the pod.

When the hand move off the axis, the distance between the sensors elements and the hand changes. The difference in signals of the elements related to their relative to each other are indicative of a displacement from the center of axis. Remember the signal on a sensor decreases with the approach of the hand or finger, i.e., a control surface. The instantaneous value of a sensor signal relative to the mean value achieved at a calibration distance is indicative of the distance from the sensor to the hand or finger. Using processing to compute these values give the distance and angle to the control surface.

Speed is estimated by the derivative of the sensor signals. Angular rate is estimated by the derivative of the difference between opposing signals.

The microcontroller can handle most of these simple calculations, or with some reduced capability. Optionally, the data is sent to the host computer through a USB connection and processed for demanding computations. The calculation is performed to give MCS position and angle data at rates between 30 and 60 Hz. If higher background frequencies are used, then higher update with more demanding ADC sampling rate.

We have also demonstrated MUXed sensor data captured at higher sample rates using the compute Sound Card. Since we did not have control of the triggering precisely, we capture the LSB MUX control signal in the second channel of the Sound Blaster Audigy Platinum sound card. We capture ADC data at 96 kSa/sec, using an 8 kB buffer. Further work to control the trigger of the sound card so buffer overruns did not occur that resulted in glitches in the ADC data. We propose that this may be overcome by working with Microsoft or Creative Labs sound card company, or other suppliers.

Next, the HID class of the USB controller is used to access the mouse. The mouse, or the object is rotated or shape controlled by the location of the hand relative to the pod. In this manner people can move their hand with the pod, and we can compensate for its motion, so we move the mouse according to a relative motion or trajectory between the hand and pod.

The control surface the hand, can be other parts of the body or other people when they are connected electrically directly, or by a circuit that controls the common potential between them. Also modulation of the common potential is possible through current limit voltage control circuit. Hence, different motions can be recognized if there is a feedback from the game through video, or electric means of other sensors or controls in the game requesting information from an individual or others.

Gesture recognition is also possible and will require sufficient computing resources and now can be handled by the host PC, but in the future can be processed in a hand held device.

If we wish to observe brain waves or nerve firings, such as reported by JPL throat sensor, or others looking at electric fields coming from the head, we would want to notch filter or low pass filter the signal prior to amplification. Then follow this with a digital filter. Then we use of signal processing classifiers to recognize signals an correlate them with thoughts to control the computer. Additionally it is possible to take advantage of using the high input impedance sensors without bias electrical components, when using a MCS sensor to detect motion of the body or parts thereof in proximity to the Low frequency Sensor.

Imaging: from Provisional 61/070,106

For imaging applications the body is exposed to an external electric field provide by a source electrode or plate driven by a voltage source. The spatial modulation of the electric field is measured. This is done by moving the sensor to different locations followed by a measurement, or making measurements on sensor elements that are spatially distributed in the array. Alternatively, the body may be moved like for scanning luggage for security.

The source electrode may also be made to move by switch its spatial location. The source electrode may also be as source of charge such as that deposited by electrode beams, or optically liberated electrons as created by incident photons. In the apparatus discussed for imaging herein, the source signals are generated by a computer video card voltage output sent to a conducting plate. The video signal is a tone or digital waveform that can be made to sweep the bandwidth of about 30 MHz. The signals from the amplifiers of the sensor are then coherently captured on a digital oscilloscope, comprised of an amplifier and an analog to digital converter.

The data acquisition for imaging is done repeating the procedure of applying the source field to the body and precisely captured on the Oscilloscope or digital to analog converter. This is called coherent processing. The signal to noise ratio goes up with increasing number of captures. The starting phase of the waveform is maintained for each transmitted pulse, and the captured is timed to coincides a fixed amount of time from the transmitted. The transmitted signal is generated from the video signal sent to the monitor at a refresh rate set by the monitor. After a fixed number of lines have been transmitted, the signal is captured. Thus we captured signals produced by the same line of video, at a rated determined by the number of lines allowed to pass between captures. The detected signal parameters are the power spectrum of the signal, and the phase shift of the signal are computed. Spatial plots are made of the signal power level, and phase of these spatially sampled waveforms. After normalization, and compression, or companding depending upon the dynamic range of the signals, the contrast or difference in the parameters versus spatial location are what form an image or picture of the body.

The electric field arriving at the sensors depends upon the material between the source and the sensor. Different molecular polarizabilities, or equivalently, dielectric constants are well known to affect the electric field strength. Some hazardous materials that might be explosive include nitrates. Many nitrates based materials have a dielectric constants around 20. This is about 4 times that most building materials around 4-5. Water has a high dielectric constant of about 80. Soft tissues also exhibits an increase in dielectric constant with decreasing frequency. Tumors are known to have a larger increase with decreasing frequency than health tissue, and show this effect below 100 MHz.

To avoid common mode modulation of the signals from background signals, the difference between signals on sensors is formed. The difference is taken with the average value of the instantaneous signal. This is done by monitoring a group of sensors or a sensor a fixed distance from a specific sensor used for the measurement. The difference is formed from this average sensor output. Thus there is a common mode sensor used that can be an average of many surrounding sensors or even just a neighboring sensor.

Imaging (New Addition to Provisional)

Using the differential arrays in FIG. 7 to increase gain and have direction focus to receive E-fields. Also the 3D array in FIG. 3 or a smaller subset can be used to scan the body for E-fields, the difference channel, in a given direction about the surface of the body. Hence normal components of the body E-field can be measured on curved bodies hat provides indication of the voltage potential on the surface. Also flat panel arrays for scanning measurements are contemplated as being useful. Even the range metric is a good way to have the measurement be essentially independent of source Field amplitudes seem useful to make repeated and meaning full measurement. Even combining a range measurement to the surface being scanned can then allow for extraction of attenuation coefficient by using the difference channel to compute the spatial derivative, and the average channel to be the spatial value of the voltages detected.

Proximity Detection from Provisional 61/070,106:

To proximity detect the change in the background or an applied signal is detected. The complexity of integrating and array of sensors is now greatly reduced with this invention. The FETs are connected sensor elements that are switched in time. The E-field signature is detected from each element in time, and the one element with the largest discriminating signal indicative of proximity is used to specify the location of the body at that time.

The body detected can be one connected to a signal from the sensor. It can also be an object that is creating an electric field like a movement of a piece of charge plastic, either permanently charged or charged it movement in the air, like a wand, or an arrow. The array senses signals through objects, thus it can be located behind a target, for example an archery target. When the arrows are shot the static charge from the arrow, can be detected and localized by the grid. The arrow may provide signature enough, or it can be enhanced by putting a plastic piece on the tip or other part of arrow to augment the arrow signature. Now the score of the shot can be shown be computed and shown, or a replay of the video target can be shown. This can also work with bullets with this type of array. However, the array needs to be located behind a nonconductive surface so as not to shield the object. A Kevlar material or similar may be used to stop the bullet damage of the detection array.

FIG. 1 shows a sensor used to detect a person's finger in a motional control operational mode. A potential of the person is applied to the person's body as the common of the battery used to drive the sensor. The output of the sensor is across R3. The following signal filter is used to aid in the detection and capturing of the desired motional command signal. The Signal conditioning and Detection circuitry can be made differential to isolate the body and the sensor common line from the earth ground. The later is important if we do not want to earth ground the body. Then the sensor only responds to signal of a body at the common potential of the sensor. The signal conditioning circuitry is used to filter out transients of other peoples footsteps, or other static charge discharges. This is a DC potential if more desirable, and AC potential, or a combination of both. DC potential is like static electricity and is small compared. The current is limited by a resistor not shown in FIG. 1, but would connect the common to the body electrode. The detection is done by a method described earlier, either amplitude of DC or AD changes of the background, or using an active AC signal applied to the body, or an active signal generator of the background, or by some other modulation scheme of the detected DC or AC signals. IF the body is driven with an AC signal, the sensor picks up an increased level as the body approach the sensor. If the body is drive with a potential of the common then the gain, both DC and AC gains decrease, of the sensor decrease as the body moves closer to a sensor. IF the body is driven at another potential it can not made relative to the common, then this signal is detected as an external signal. Depending upon the particular configuration used, the appropriate changes in the signal level are used to detect the presence of the body near the sensor.

FET Sensors: from Provisional 61/070,106

The JFETs come in types, N-channel and P-channel. MOSFETs come in types too, Enhancement Type, and Depletion type. What is common with these devices is they all have a conduction channel or current from Source to Drain that depends upon the source to gate voltage or what we call the "bias voltage". The polarity of the voltage is related to the N or P type. Depletion types MOSFETs have are equivalent to N channel JFETs. MOSFETs offer higher input impedance because their gate is insulated from the other components by the oxide or glass. Enhancement MOSFETs are called "always on" types and are used in logic circuitry and memory chips, because the conduction channel is always on with no bias voltage. What ever type the conduction is controlled by a bias.

They have a conduction channel or junction that allows electricity flow to be controlled by an electric field applied at the junction or the gate. These devices and offer high input in GigaOhms to TeraOhms. The FETs in an element configured as an amplifier with a electric field sensing antenna or equivalently called an electrode. FETs or more specifically used MOSFETs are commonly used in integrated circuits because their manufacturing allows for higher transistor count densities than JFETs. Additionally, these type of devices or similar devices having the stated desired properties can be made using Thin Film Transistor (TFT) technology. This invention shows how to make an E-field sensor and extend this to an making an array of sensors comprised of FETs. The E-field sensor array has potential to be manufactured into sensor panels imaging applications. Sensor panels or sensor covering or skins are useful for in controlling electronic apparatus control and for computer interfaces application. In future applications, the sensor arrays described herein have a possibility of being integrated into LCD or flat panel display apparatus.

FIG. 1 shows a common Drain setup using a N-channel JFET MPF-102 sensor. Common Source type is also possible but it requires a bypass capacitor on the drain resistor.

The gate of the JFET is floating. FIG. 3b shows an amplifier that also has a JFET for the front end. This amplifier circuit was used in imaging as a single element E-field sensor with success. Since it has the bias resistors, it works without the reference electrode, but suffers from sensitivity and complexity of wiring, and increased component counts. It has a high pass filter that goes to the video amplifier. FIG. 3b is a broadband amplifier. To make an array, the bias resistor complicate the wiring and component count so the arrangement in FIG. 1 is used.

For low frequency background signals, the filter is turned to a low pass type. Also the DC offset from the gate resistor needs eliminated. A differential amplifier works to subtract off the mean value of the output. FIG. 11 shows the circuit in 60/881,672, that is used to take off the average background signal, or chip differential amplifier like an INA105 or INA106 amplifier like that used in the U.S. Pat. No. 7,078, 911, and in application number Ser. No. 10/978,142.

FIG. 11 also shows a way to apply a signal that is the opposite of the DC offset from an opamp based sensor. The procedure was used to generate a reference electrode for a signal element. This is labeled in the drawing as drive electrode. It also has a positive feedback electrode that can be used to apply positive E-field feedback, to get the extended response to proximity. The multiplexer or MUX is shown as an optional part, that can switch buffered outputs from our FET sensors. FIG. 11 also shows the adder that takes the background signal to a DC level needed to create an AC modulation of that signals into the detector or AC modulator. The AC modulator is the buffer amplifier following the adder opamp circuit. The idea of the drive electrode was to drive a reference electrode, in this case the shield of coax to the negative DC offset potential that is detected at the output of the first buffer just after the MUX. This worked well, where the MUX was not in place and operated on a single element that was about 10 inches long ½ inch wide copperstrip electrode. The coax was RG174 U, about 3 ft long. Such configuration is useful for controlling the reference electrode of an array, where the desired DC output level is sensed, and a feedback circuit is used to control the output of the E-field sensor to get the desired output.

Some MOSFETs require no DC bias circuitry and can also be used directly, and are also covered under this invention.

Array Descriptions: from Provisional 61/070,106

FIG. 1 shows a sensor element. It shows a reference electrode that has a potential so that it can control the gate to source voltage with the generated electric field on the gate. The body electrode, is placed on the preferably on the back of the portable device like a phone or PDA. It sets the users body potential to that of common. As the body moves its other hand near the antenna electrode connected to the gate, the bias voltage changes and the conduction of the drain current through R3 changes. This results in a DC signal change as well as an AC gain change. So any AC signal present on the drain current will see a decrease. This AC signal comes mostly from the antenna electrode background, mostly 60 Hz in US, but also can come from the power supply. In the AC & DC Coupled E-field sensor application, Cehelnik showed how the AC and DC signals are coupled. In fact, it is now known and claimed that the DC signal going into the opamp, will cause a decrease in the AC gain of the opamp like the TL-082, and other JFET opamps. From experimentation with the circuit AC &DC field sensor shown in 60/881,672 and repeated here as FIG. 11, we also recognized that we can detect the DC signal into these devices as a corresponding AC decrease, when the DC input is adjusted to a sensitive bias point.

FIG. 8 shows a 2D array of FET sensors. The column of M sensors are selected by multiplexing the power source. The row of N elements are selected by multiplexing the drain output across the load resistor. The signals then are filtered appropriately to detect the desired signal appearing on the antenna electrodes of the gate. The gates electrodes not shown in FIG. 8, but can be connected to the gate by a trace to the top of the circuit board. The reference electrode is not shown on FIG. 8, but FIG. 1 shows it. The reference electrode is connect to a conducting layer beneath the sensing electrodes, or made to surround the sensing electrodes on the top surface. Manufacturing is perhaps easier below. We have also made sensing electrodes protrude from the surface of the circuit board using headers.

FIG. 3a herein, and FIG. 4 of the provisional 61/070,106, and shows a circuit board layout for a two dimensional array used for detection proximity of an object. It uses the FETs as shown in FIG. 8, corresponding to FIG. 2 of the provisional, but they are not populated in the drawing. What to notice is the array is it has a horizontal array of electrodes on layer of a circuit board, and another orthogonal array on the other side. Each horizontal and vertical array elements have a FET. The outputs are drains are multiplexed across a signal load resistor Rload, like in FIG. 2 to conserve power. It is also apparent that in FIG. 8 and FIG. 11 that individual load resistors can be used on the drain of each FET. This will reduce transient time in switching, and is also a configuration covered. Also, the case where each FET power supply is also turned on is also covered.

Those familiar with the art are also able to construct other amplifier configurations, to give more gain or other amplifier topologies. These are also covered. If bias resistor are used, this is also covered, as it is the topology of creating a multiplexed array of E-field sensors that is the general coverage.

The arrays can be integrated as sensor pads or into displays using thin film transistor manufacturing technology along with transparent MgO or equivalent conducting circuit traces. The multiplexing would then follow that similar to used in providing power to LCD pixel element, but would use an analog multiplexer to receive signals from the E-field sensor elements. Video monitor like CRTs and LCD have a bias E-field near their surface already. The surface layer is usually a ground plane, and thus the provision is needed construct the video panel in such a way that the embedded E-field sensors are not shielded or all provided with the same E-field because of a conducting plane.

After assembling an 8 element array with MPF102 FETs, with antennas separate about ¼ and about 3.5 inches long, we observed some reverse leakage or conduction seemed to degrade the array performance. Thus we contemplate the use of diode switch to help prevent the reverse leakage from one antenna to another. We noted that by reducing the number of connected sensors, the coupling also decrease and the elements worked more independently.

Also when the antenna is short about 4 inches the DC signal drift into saturation. Increasing the antenna length eliminated this problem. The reference electrode can also work. It was noted that when we touch the antenna and thus put charge on the antenna and fix the voltage on the antenna, the AC signal gain worked well. This dissipated with a some time constant of ⅒ s of a second.

Thus we contemplate the use of a switched capacitor circuit. A switch capacitor would switch in time to the antenna and transfer a voltage to the gate, an then switch out of the circuit thus allowing high input impedance, but providing a bias voltage to keep the FET or MOSFET transistor amplifier operating without saturation.

The capacitor would be like that used in a sample and hold circuit. The capacitor is charged to a voltage Vbias by switching it to a bias voltage source of Vbias. Then it is switch from the source voltage to the gate. Then the gate is charged, and left floating, during which the measurements of the amplifier are made. The process is repeated cyclically. The capacitor is a chip capacitor that is small with a capacitance of the order of a picoFarad. For a FET with a gate input impedance of 10 to 100 GigaOhms, the time constant is 1/100 to 1/10 of a second. This means the charge transfer can be completed and a sample rate of 100 to 10 samples per second can be achieved.

Yet another means of charging the transistor gate is a photoconductive material. In this case the gate is coated with a photo-charge generating material. Then by turning on a light such as another layer of a LED, the floating gate can be maintained at a potential by transfer charge. A feedback control circuit is also contemplate to monitor the DC bias and make the adjustment accordingly. Two types of charge can be generated holes and electrons to maintain a constant net charge and hence constant bias potential. The bias potential should ideally give control like that of standard bias circuit such as that of a voltage divider bias configuration. Engineers working in this field of amplifier design would now be able to make various bias designs from my description. Nevertheless, some nonlinearity is acceptable if we look for the modulation of the AC signal gain by shifting the bias voltage from its nominal position with a quasistatic Getting the bias in the right neighborhood to allow nonsaturation of the amplifier, the reference electrode can help further adjust the DC bias.

The invention claimed is:

1. A device for detecting the presence and proximity, or the motion of interest of a user's body within a sensing area of the device, comprising:
   a first sensing electrode for sensing an AC electric potential produced by an electric field within the sensing area;
   a power supply providing a DC voltage source and a common reference voltage;
   a field effect transistor (FET) having a gate with high input impedance of approximately 1 GOhm or greater;
   having with a wherein the gate junction is electrically coupled to the sensing electrode by a high input impedance gate bias circuit;
   and the FET is configured as an amplifier having an output signal from the FET that is further filtered by a circuit to suppress substantially low frequency noise from body movements and power mains noise and harmonics while passing the signals of interest to a sensor output wherein the signals of interest are representative of the electrical potential sensed on the sensing electrode measured relative to the common reference voltage;

a high input impedance gate bias circuit for controlling the electric AC and DC potential on the gate junction to ensure the stability and linearity of the amplifier and to maintain the sensitivity of the amplifier to the electric potential on the sensing electrode thus such that together with the FET amplifier creates a high input impedance amplifier;

wherein the gate bias circuit is configured to provide attenuation and with a series resistor; and with an effective amount of equivalent AC shunt resistance greater than 2.5 MegaOhm; chosen to provide substantial FET amplifier sensitivity to signals of interest within the electric potential sensed, so when combined with the properties of the sensing first electrode and the FET suppress the substantially low frequency noise caused from body movement, from being overly sensed by the FET amplifier, thus resulting in a filtered FET amplifier output passing signals of interest occurring at AC audio frequencies and higher frequencies while maintaining the high input impedance of 2.5 MOhm or greater;

a DC bias circuit for controlling the flow of current through the FET from the DC voltage source to the common reference voltage; and a processor for performing computing, interpreting results and providing a response; and the sensor output is sampled by an analog to digital convertor and digitally filtered (digitally or by circuitry) to pass frequencies contained within the signal of interest to a detector that recognizes the signal of interest by using a signal recognition algorithm in a computation by the processor; and an AC signal source adapted to a transmit electrode to generate an AC electric field in the sensing area, and wherein an AC signal of interest being sensed by the sensing electrode includes the AC electric field from the AC signal source; and when the processor recognizes the signal of interest it provides an indication of the proximity of the transmit electrode to the sensing electrode.

2. A device for detecting presence or motion of interest in a sensing area according to claim 1; whereby as the user moves a body part toward the transmit or first sensing electrodes within the sensing area causes the AC signal to experience a signal change; and a means for recognizing the signal change with the user's body presence or motion of interest by using the sensed AC signal; and a means of issuing a control signal indicative of the user's body presence or motion of interest within the sensing area.

3. A device for detecting presence or motion of interest in a sensing area according to claim 1, wherein the gate bias circuit comprises a capacitor located between the sensing electrode and the gate of the FET and furthermore results in the high pass filtering of the signal of interest that reaches the gate of the FET.

4. A device for detecting presence or motion of interest in a sensing area according to claim 1, wherein the AC signal source adapted to generate the AC electric field in the sensing area is electrically coupled to the user's body.

5. A device for detecting presence or motion of interest in a sensing area according to claim 1, wherein the area in which presence or motion is to be detected is an area surrounding a device to be controlled by motion of a user, wherein the AC signal source is coupled to the user so the AC signal from the AC signal source generated in the area is generated through the user; wherein variations in the AC signal from the AC signal source being sensed by the E-field sensing antenna indicates said presence or motion of the user in the area, and wherein particular sensed variations in the AC signal from the AC signal source provide control signals for controlling the device to be controlled.

6. A device for detecting presence and proximity, or motion of interest of a user's body within a sensing area of the device in accordance with claim 1 additionally including;

a second sensing electrode for conducting the electric potential due to the presence of an electric field in a sensing area;

a second high input impedance amplifier having its input coupled to the second sensing electrode and having a second amplifier output representative of the electric potential on the second sensing electrode;

an second electrical bias network for controlling the stability of the second high input impedance amplifier by controlling the bias currents to keep the second amplifier output representative to changes in the electric potential on the second sensing electrode;

and the output of the second amplifier is coupled to a signal filter to pass audio frequencies to an output;

whereby a receiver processes the output as a signal representative of the information produced by the electric field in the sensing area by creating a difference signal obtained by forming a difference operation between the high input impedance amplifier output and the second high impedance amplifier output; thus providing a difference signal representative of the AC electric field between the sensing electrode and the second sensing electrode; and the signal change of the sensed AC signal includes the difference signal.

7. A device for detecting presence or motion of interest in a sensing area according to claim 1, additionally including a difference circuit for reducing common-mode signals between the amplifier output and the common reference voltage; whereby when the user's body is making electrical contact with the common reference voltage results is the suppression of the substantial low frequency interference produced as the user's body moves , and step and shuffling their feet.

8. A device for detecting presence or motion of interest in a sensing area according to claim 7, additionally including a high pass filter coupling the amplifier output to the input of the difference circuit.

9. A device for detecting presence or motion of interest in a sensing area according to claim 1; where in the AC signal source is in the frequency range of the receiving sensor and produces a modulated signal of interest; and the transmit electrode and the sensing electrode are further electrically coupled to one another by the conductivity of the user's body; and the processor provides the demodulated signal as the indication of proximity between the user and the sensing electrode.

10. A device for detecting presence and proximity, or motion of interest of a user's body within a sensing area of the device in accordance with claim 6 wherein a metric is calculated by a processor as a ratio of the representation of the AC power of the output of the first sensor output to the difference signal level and this ratio is used as the means of recognizing the signal change with the user's body presence or motion of interest wherein the AC signal source is coupled to the user's body.

11. A device for detecting presence and proximity, or motion of interest of a user's body within a sensing area of the device in accordance with claim 10 wherein a representation of the AC power of the sensed AC signal as represented by output of at least one of_the high input impedance amplifiers and the difference signal are used as a metric which is the means of recognizing the signal change of the sensed AC signal with the user's body presence or motion of interest.

12. A device as in claim 10 additionally including a processor for processing and using a range metric computed as a representation or approximation of the ratio of the average output power from the two sensors to the difference of powers to give an approximate linear representation of the distance of the AC signal source location.

13. A device as in claim 9 where the modulated signal is in the audio frequency range.

14. A device as in claim 13 wherein the signal source audio modulation is produced by a sound player device.

15. A device as in claim 14 wherein the sound player device is a computing device's digital sound card player output.

16. A device as in claim 15, wherein the computing device is a mobile computing device.

17. A device as in claim 9 wherein the audio is recorded in a digital audio recording device instead of a standalone ADC device.

18. A device as in claim 17 where the audio recording device is a computing device's digital sound card recorder.

19. A device as in claim 18, wherein the computing device is a mobile computing device.

20. A device as in claim 19, wherein the password or key is used to activate a device by knowing the audio signal is short range thus knowing the creator of the signal source is in close proximity of the receiving first sense electrode.

21. A device as in claim 9 when the modulation contains a message containing digital password or key.

* * * * *